(12) United States Patent
Hitomi et al.

(10) Patent No.: US 9,564,153 B2
(45) Date of Patent: Feb. 7, 2017

(54) SUBSTRATE FOR SUSPENSION, PROCESS FOR PRODUCING THE SAME, SUSPENSION FOR MAGNETIC HEAD, AND HARD DISK DRIVE

(71) Applicant: Dai Nippon Printing Co., Ltd., Tokyo (JP)

(72) Inventors: Yoichi Hitomi, Sakado (JP); Shinji Kumon, Kitamoto (JP); Terutoshi Momose, Higashimatsuyama (JP); Katsuya Sakayori, Kamifukuoka (JP); Kiyohiro Takachi, Tsukuba (JP); Yoichi Miura, Kawagoe (JP); Tsuyoshi Yamazaki, Saitama (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 10 days.

(21) Appl. No.: 14/551,663

(22) Filed: Nov. 24, 2014

(65) Prior Publication Data

US 2015/0079424 A1    Mar. 19, 2015

Related U.S. Application Data

(62) Division of application No. 12/528,676, filed as application No. PCT/JP2008/057245 on Apr. 14, 2008, now Pat. No. 8,927,122.

(30) Foreign Application Priority Data

Apr. 18, 2007  (JP) .................. 2007-109279
May 11, 2007  (JP) .................. 2007-126588

(51) Int. Cl.
*G11B 5/60* (2006.01)
*B05D 5/12* (2006.01)
(Continued)

(52) U.S. Cl.
CPC .......... *G11B 5/3133* (2013.01); *G11B 5/3103* (2013.01); *G11B 5/486* (2013.01); *H05K 1/056* (2013.01);
(Continued)

(58) Field of Classification Search
None
See application file for complete search history.

(56) References Cited

U.S. PATENT DOCUMENTS 5,771,569 A    6/1998 Inaba
5,883,758 A    3/1999 Bennin et al.
(Continued)

FOREIGN PATENT DOCUMENTS

CN    1374639 A    10/2002
JP    01-245064 A1    9/1989
(Continued)

OTHER PUBLICATIONS

JPO Abstract Translation of JP 2006-270029 A (published 2006).*
(Continued)

*Primary Examiner* — Kevin Bernatz
(74) *Attorney, Agent, or Firm* — Burr & Brown, PLLC

(57) ABSTRACT

A substrate for suspension comprises a metallic substrate, an insulating layer formed on the metallic substrate, a conductor layer formed on the insulating layer, and a cover layer covering the conductor layer. The insulating layer and the cover layer are formed from different materials, whose coefficients of hygroscopic expansion are in the range between $3\times10^{-6}/\%$ RH and $30\times10^{-6}/\%$ RH. The difference between the coefficients of hygroscopic expansion of the two materials is $5\times10^{-6}/\%$ RH or less.

4 Claims, 8 Drawing Sheets

(51) Int. Cl.
*H05K 1/05* (2006.01)
*G11B 5/48* (2006.01)
*H05K 3/28* (2006.01)
*G11B 5/31* (2006.01)

(52) U.S. Cl.
CPC ............... *H05K 3/285* (2013.01); *H05K 3/28* (2013.01); *Y10T 428/11* (2015.01); *Y10T 428/1157* (2015.01); *Y10T 428/1179* (2015.01)

(56) References Cited

U.S. PATENT DOCUMENTS

| | | | |
|---|---|---|---|
| 6,658,722 B1* | 12/2003 | Kurita | G11B 5/484 216/22 |
| 6,998,455 B1* | 2/2006 | Ohta | C08G 73/10 526/310 |
| 7,211,332 B2 | 5/2007 | Watanabe et al. | |
| 8,064,169 B2 | 11/2011 | Higashi et al. | |
| 8,441,761 B1 | 5/2013 | Hahn et al. | |
| 2002/0155710 A1* | 10/2002 | Okamura | C08G 73/1042 438/689 |
| 2006/0023435 A1 | 2/2006 | Ooyabu et al. | |
| 2006/0127685 A1* | 6/2006 | Hirota | B32B 15/08 428/458 |
| 2006/0190673 A1 | 8/2006 | Arai et al. | |
| 2008/0057299 A1 | 3/2008 | Adachi et al. | |
| 2008/0247093 A1* | 10/2008 | Higashi | G11B 5/4833 360/244.8 |
| 2010/0047626 A1 | 2/2010 | Hitomi et al. | |
| 2015/0079424 A1 | 3/2015 | Hitomi et al. | |

FOREIGN PATENT DOCUMENTS

| | | | |
|---|---|---|---|
| JP | 02-018987 A1 | | 1/1990 |
| JP | 09-293222 A1 | | 11/1997 |
| JP | 10-224017 A1 | | 8/1998 |
| JP | 2000-195032 A | | 7/2000 |
| JP | 2000-195032 A1 | | 7/2000 |
| JP | 2001-313451 A1 | | 11/2001 |
| JP | 2005-285178 A | | 10/2005 |
| JP | 2006-040414 A1 | | 2/2006 |
| JP | 2006-054474 A | | 2/2006 |
| JP | 2006-209853 A | | 8/2006 |
| JP | 2006-248142 A1 | | 9/2006 |
| JP | 2006-270029 A1 | | 10/2006 |
| JP | 2006270029 A | * | 10/2006 |
| JP | 2007-095136 A1 | | 4/2007 |
| JP | 2008-251121 A | | 10/2008 |
| JP | 5234146 B2 | | 7/2013 |
| WO | 2004/073975 A1 | | 9/2004 |

OTHER PUBLICATIONS

Japanese Office Action (with English Translation) (Application No. 2013-058483) dated Apr. 14, 2015.
Chinese Office Action (With English Translation) Chinese Application No. 201110164600.8, dated Apr. 28, 2014 (12 pages).
Chinese Office Action dated Aug. 14, 2013 (with partial English translation).
Japanese Office Action dated Jun. 15, 2012 (with English translation).
Japanese Office Action (With English Translation) Japanese Application No. 2008-109195, dated May 24, 2011 (9 pages).
Japanese Office Action (With English Translation) Japanese Application No. 2011-160999, dated Aug. 14, 2012 (5 pages).

* cited by examiner

US 9,564,153 B2

SUBSTRATE FOR SUSPENSION, PROCESS FOR PRODUCING THE SAME, SUSPENSION FOR MAGNETIC HEAD, AND HARD DISK DRIVE

CROSS-REFERENCE TO RELATED APPLICATIONS

The present application is a divisional of U.S. patent application Ser. No. 12/528,676, filed Aug. 26, 2009, which in turn is a National State of PCT/JP2008/057245, filed Apr. 14, 2008, the entireties of which are incorporated herein by reference.

BACKGROUND OF THE INVENTION

Field of the Invention

The present invention relates to a substrate for suspension for use in a hard disk drive (HDD) or the like, and, more particularly, to a substrate for suspension that warps only a little even when it has decreased rigidity.

Background Art

In recent years, the spread of the Internet, etc. have generated demand for personal computers increased in information processing capacity and speed. To meet this demand, it has come to be needed to increase the storage capacity and information transmission rate of hard disk drives (hereinafter sometimes referred to simply as HDDs) incorporated in personal computers. As for a component called a magnetic head suspension that is used to support a magnetic head in an HDD, a conventional suspension to which signal conductors made of gold wires or the like are connected has come to be replaced with a so-called wireless suspension of conductor-integrated type (flexer), in which signal conductors made of copper lines or the like are formed directly on a stainless-steel-made spring.

Demand on HDDs for use in a variety of small-sized devices including mobile phones has increased recently, and disks on which information is recorded have become smaller in size and higher in recording density with the increase in the demand. To read out the data from, or write the date on, tracks on a disk with a smaller diameter, it is necessary to revolve the disk slowly, i.e., to reduce the speed of the disk relative to a magnetic head (circumferential speed). A substrate for suspension therefore needs to access the disk with a weaker force, so that it is necessary to produce a substrate for suspension having decreased rigidity.

A laminate of a metallic substrate, an insulating layer, a conductor layer and a cover layer that are laminated in the order named, each layer being formed pattern-wise, has been commonly used for a substrate for suspension. As a technique for making such a substrate for suspension less rigid, there has been discussed decreasing the percentage of the metallic substrate, a material having relatively high rigidity, that remains in the substrate for suspension finally obtained.

However, when the metallic substrate, which has high rigidity, remains with a decreased percentage, the substrate for suspension tends to warp.

The difference between the coefficient of thermal expansion of the metallic substrate and that of the insulating layer has been considered to be the cause of warping of the substrate for suspension. Patent Document 1 discloses a technique for reducing the tendency of the substrate for suspension to warp, in which the insulating layer is formed from a resin whose coefficient of thermal expansion is nearly equal to that of the metallic substrate.

The substrate for suspension that has decreased rigidity because of the metallic substrate remaining with a decreased percentage, as described above, has been at a disadvantage in that its tendency to warp cannot be satisfactorily reduced only by decreasing the difference between the coefficient of thermal expansion of the metallic substrate and that of the resin for forming the insulating layer.

[Patent Document 1] Japanese Laid-Open Patent Publication No. 2006-248142

SUMMARY OF THE INVENTION

In the light of the above-described drawbacks in the prior art, the present invention was accomplished. A major object of the present invention is to provide a substrate for suspension that warps only a little even when it has decreased rigidity.

Another object of the present invention is to produce a low-rigidity substrate for suspension with high yields.

In order to fulfill the above objects, we made earnest studies and, as a result, found the following: when the coefficients of hygroscopic expansion of the above-described insulating layer and cover layer that are laminated to the metallic substrate are made lower, and, moreover, when the difference between the coefficient of thermal expansion of the insulating layer and that of the cover layer is made smaller, there can be obtained a substrate for suspension that warps only a little even when it has decreased rigidity. The present invention was accomplished on the basis of this finding.

The present invention is a substrate for suspension, comprising a metallic substrate, an insulating layer formed on the metallic substrate from an insulating-layer-forming material, a conductor layer formed on the insulating layer, and a cover layer formed on the insulating layer from a cover-layer-forming material, covering at least a part of the conductor layer, the insulating-layer-forming material and the cover-layer-forming material having coefficients of hygroscopic expansion of 0/% RH to $30\times10^{-6}$/% RH, the difference between the coefficients of hygroscopic expansion of the two materials being in the range between 0/% RH and $5\times10^{-6}$/% RH.

Further, the present invention is a substrate for suspension, comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being different materials, the coefficients of hygroscopic expansion of the two materials being in the range between 0/% RH and $30\times10^{-6}$/% RH, the difference between the coefficients of hygroscopic expansion of the two materials being $5\times10^{-6}$/% RH or less.

According to the present invention, since the coefficient of hygroscopic expansion of the insulating-layer-forming material, the coefficient of hygroscopic expansion of the cover-layer-forming material, and the difference between the coefficients of hygroscopic expansion of the two materials are in the above-described respective ranges, the substrate for suspension of the present invention warps only a little even when it has decreased rigidity.

Further, since different materials are used as the insulating-layer-forming material and the cover-layer-forming material, it is easy to select, for the insulating material, a material that never dissolves when the cover layer is formed on it.

The present invention is the substrate for suspension, in which the insulating-layer-forming material and the cover-layer-forming material have coefficients of thermal expansion of $15 \times 10^{-6}/°$ C. to $30 \times 10^{-6}/°$ C., and the difference between the coefficients of thermal expansion of the two materials is $10 \times 10^{-6}/°$ C. or less.

Since the coefficient of thermal expansion of the insulating-layer-forming material, the coefficient of thermal expansion of the cover-layer-forming material, and the difference between the coefficients of thermal expansion of the two materials are in the above-described respective ranges, the substrate for suspension is warped by temperature change only a little even when it has decreased rigidity.

The present invention is the substrate for suspension, in which both of the insulating-layer-forming material and the cover-layer-forming material, or either of the two, is non-photosensitive.

Since the insulating-layer-forming material and the cover-layer-forming material are non-photosensitive, there is no need to add a photosensitizing component. It is therefore easy to control the physical property values, such as the above-described coefficient of hygroscopic expansion and coefficient of thermal expansion, of the two materials.

The term "non-photosensitive material" herein refers to a material that cannot be patterned by the action of light when it contains no additives and that must be patterned in the following manner. Unnecessary portions of a layer of the material are removed by applying a liquid, gas or plasma to the layer through openings in a metal- or resist-made mask placed on the layer; or the material is applied pattern-wise by such a technique as ink-jet printing or screen process printing.

More generally, the term "non-photosensitive material" refers to a material that forms a pattern although it contains no photosensitive component.

The use of a non-photosensitive material makes the process of pattern formation complicated, but makes it possible to use a purer material containing no photosensitive component. This is advantageous in that the material can be selected from a wider range. It is thus possible to use a material having both low hygroscopic expansibility and low linear thermal expansibility, which are the characteristics essential in the present invention.

The present invention is a substrate for suspension, comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being the same non-photosensitive material, the coefficients of hygroscopic expansion of the two materials being in the range between $0/\%$ RH and $30 \times 10^{-6}/\%$ RH.

According to the present invention, since the insulating-layer-forming material and the cover-layer-forming material are the same non-photosensitive material, and the coefficients of hygroscopic expansion of the two materials are in the above range, it is easy to control the physical property values, such as coefficient of hygroscopic expansion and coefficient of thermal expansion, of the materials. Moreover, the substrate for suspension of the invention warps only a little even when it has decreased rigidity.

The present invention is the substrate for suspension, in which the insulating-layer-forming material and the cover-layer-forming material have coefficients of thermal expansion of $15 \times 10^{-6}/°$ C. to $30 \times 10^{-6}/°$ C.

Since the coefficient of thermal expansion of the insulating-layer-forming material and that of the cover-layer-forming material are in the above-described range, the substrate for suspension is warped only a little by temperature change even when it has decreased rigidity.

From the viewpoint of prevention of warping of a suspension, it is preferred that the insulating-layer-forming material and the cover-layer-forming material in the present invention have a repeating unit represented by the following general formula:

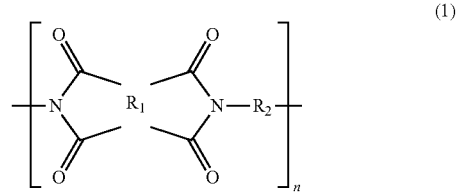

wherein $R_1$ is a tetravalent organic group, $R_2$ is a divalent organic group, $R_1$ and $R_2$ being either a single structure or a combination of two or more structures, and n is a natural number of 1 or more.

Since the insulating-layer-forming material and the cover-layer-forming material for use in the invention are required to have low hygroscopic expansibility and low linear thermal expansibility, they are preferably polyimides represented by the above formula. Polyimides have high thermal resistance and excellent insulating properties because of their rigid skeletons, as well as linear thermal expansibility comparable to metals. Moreover, polyimides can form layers having low hygroscopic expansibility.

From the viewpoint of prevention of warping of a suspension, it is preferable to use polyimides having aromatic skeletons as the insulating-layer-forming material and the cover-layer-forming material in the present invention. Of a variety of polyimides, polyimides having aromatic skeletons have high resistance to heat, their thin films are excellent in insulating properties, and their coefficients of linear expansion are low, because their skeletons are rigid and highly flat. Therefore, they can be favorably used in the present invention.

From the viewpoint of prevention of warping of a suspension, it is preferred that 33 mol % or more of $R_1$ in the above formula of the repeating unit contained in the insulating-layer-forming material and the cover-layer-forming material in the invention be a group represented by the following formula:

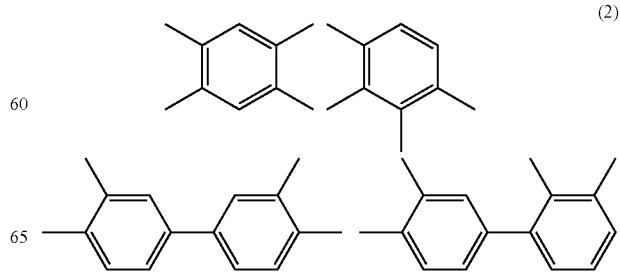

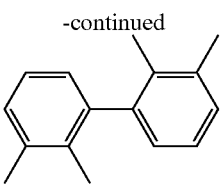

When the insulating-layer-forming material and the cover-layer-forming material have a group represented by the above formula, their linear thermal expansibility and hygroscopic expansibility are low because the skeleton of the group is rigid. Moreover, such polyimides are advantageous also in that they are readily available from the market and are inexpensive.

From the viewpoint of prevention of warping of a suspension, it is preferred that 33 mol % or more of $R_2$ in the above formula of the repeating unit contained in the insulating-layer-forming material and the cover-layer-forming material in the invention be a group represented by the following formula:

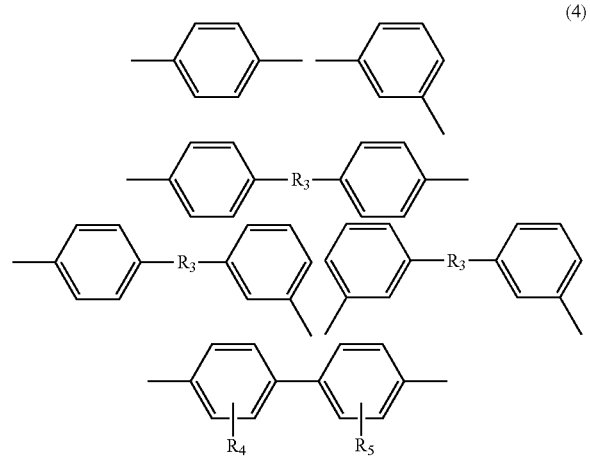

(4)

wherein $R_3$ is a divalent organic group, oxygen atom, sulfur atom, or sulfone group, and $R_4$ and $R_5$ are a monovalent organic group or a halogen atom.

When the insulating-layer-forming material and the cover-layer-forming material have a group represented by the above formula, their linear thermal expansibility and hygroscopic expansibility are low because the skeleton of the group is rigid. Moreover, such polyimides are advantageous also in that they are readily available from the market and are inexpensive.

In the present invention, it is preferred that either of, or both of, a precursor of the insulating-layer-forming material and a precursor of the cover-layer-forming material can be developed with a basic aqueous solution, from the viewpoint of facilitation of safety of working environment and reduction in process costs.

Basic aqueous solutions are inexpensive and require only low costs for waste water disposal and for facilities needed to secure the safety of working environment. This makes it possible to produce a substrate for suspension at low production costs.

The present invention is a process for producing a substrate for suspension comprising a metallic substrate, an insulating layer formed on the metallic substrate, a conductor layer formed on the insulating layer, and a cover layer formed on the insulating layer, covering at least a part of the conductor layer, the process comprising the step of insulating layer formation in which an insulating layer is pattern-wise formed from an insulating-layer-forming material on a metallic substrate, and the step of cover layer formation in which a cover layer is pattern-wise formed from a cover-layer-forming material on the insulating layer, the insulating-layer-forming material and the cover-layer-forming material being different materials, the coefficients of hygroscopic expansion of the two materials being in the range between $0 \times 10^{-6}$/% RH and $30 \times 10^{-6}$/% RH, the difference between the coefficients of hygroscopic expansion of the two materials being $5 \times 10^{-6}$/% RH or less.

According to the present invention, the insulating layer and the cover layer are formed from the insulating-layer-forming material and the cover-layer-forming material, respectively, whose coefficients of hygroscopic expansion are in the above-described range, the difference between the coefficients of hygroscopic expansion of the two materials being in the above range, so that the substrate for suspension produced by the production process of the invention is warped by moisture only a little even when it has decreased rigidity.

The present invention is the process for producing a substrate for suspension, in which the step of cover layer formation includes the step of placing, on the insulating layer, a laminate of a non-photosensitive cover-layer-forming layer formed from a non-photosensitive cover-layer-forming material and a photoresist layer formed from a photosensitive resin on the non-photosensitive cover-layer-forming layer, and the step of forming pattern-wise the cover layer by exposing pattern-wise the photoresist layer in the laminate to light and developing the exposed photoresist layer and the non-photosensitive cover-layer-forming layer at one time.

In the step of cover layer formation, the photoresist layer is pattern-wise exposed to light and then the exposed photoresist layer and the non-photosensitive cover-layer-forming layer are developed at one time, so that the formation of the cover layer requires only a smaller number of operations.

The present invention is the process for producing a substrate for suspension, in which the step of cover layer formation includes the step of applying, to the insulating layer, a liquid cover-layer-forming material containing the cover-layer-forming material.

Since a liquid cover-layer-forming material containing the cover-layer-forming material is applied to form the cover layer, it is easy to make the cover layer thinner.

The present invention is a process for producing a substrate for suspension, comprising the step of laminate preparation in which a laminate of a metallic substrate, an insulating layer, and a metal deposit that are situated in the order named is prepared, and the first metal etching step in which after forming patterned resist layers on the surfaces of the metallic substrate and of the metal deposit, the metallic substrate and the metal deposit are etched, thereby making a jig hole in the metallic substrate and forming a conductor pattern layer from the metal deposit.

According to the present invention, since the above-described laminate is used, there can be obtained a substrate for suspension having low rigidity. Further, a jig hole, a cavity, and the like are made in the metallic substrate in the first metal etching step, but the most part of the metallic substrate is not removed by etching. Therefore, etching of the insulating layer, etc. can be conducted with the rigidity of the laminate held high, and the laminate under processing can be prevented from being deformed while it is carried from one step to another.

The present invention is the process for producing a substrate for suspension, further comprising the step of cover layer formation in which a cover layer having openings so made that the surface of the conductor pattern layer is partly exposed is formed from a covering material on the conductor pattern layer, the step of insulating layer etching in which the insulating layer is etched after forming the cover layer, the step of protective deposit formation in which a protective deposit is formed on those portions of the surface of the conductor pattern layer that are exposed because of the openings in the cover layer, and the step of second metal etching step in which the external side of the metallic substrate is processed after the step of insulating layer etching and the step of protective deposit formation.

This process can provide a substrate for suspension that has more decreased rigidity.

The present invention is the process for producing a substrate for suspension, in which the difference between the maximum thickness and the minimum thickness of the metal deposit is 2 μm or less.

Since the metal deposit is etched, a conductor pattern layer uniform in thickness can be obtained. If an additive process is used to form the conductor pattern layer, the thickness of the conductor pattern layer formed is very poor in uniformity, so that it is hard to obtain a patterned film having the desired degree of rigidity.

The present invention is the process for producing a substrate for suspension, in which the difference between the maximum thickness and the minimum thickness of the cover layer on the conductor pattern layer is 1 μm or less.

The present invention is the process for producing a substrate for suspension, in which, in the step of cover layer formation, the cover layer is formed from a liquid covering material.

The present invention is a magnetic head suspension comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material having coefficients of hygroscopic expansion of 0/% RH to 30×10$^{-6}$/% RH, the difference between the coefficients of hygroscopic expansion of the two materials being in the range between 0/% RH and 5×10$^{-6}$/% RH.

The present invention is a magnetic head suspension comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being different materials, the coefficients of hygroscopic expansion of the two materials being in the range between 0/% RH and 30×10$^{-6}$/% RH, the difference between the coefficients of hygroscopic expansion of the two materials being 5×10$^{-6}$/% RH or less.

The present invention is a magnetic head suspension comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being the same non-photosensitive material, the coefficients of hygroscopic expansion of the two materials being in the range between 0/% RH and 30×10$^{-6}$/% RH.

The present invention is a hard disk drive comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material having coefficients of hygroscopic expansion of 0/% RH to 30×10$^{-6}$/% RH, the difference between the coefficients of hygroscopic expansion of the two materials being in the range between 0/% RH and 5×10$^{-6}$/% RH.

The present invention is a hard disk drive comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being different materials, the coefficients of hygroscopic expansion of the two materials being in the range between 0/% RH and 30×10$^{-6}$/% RH, the difference between the coefficients of hygroscopic expansion of the two materials being 5×10$^{-6}$/% RH or less.

The present invention is a hard disk drive comprising a substrate for suspension, the substrate for suspension comprising a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, the insulating-layer-forming material and the cover-layer-forming material being the same non-photosensitive material, the coefficients of hygroscopic expansion of the two materials being in the range between 0/% RH and 30×10$^{-6}$/% RH.

The present invention has the effect of providing a substrate for suspension that warps only a little even when it has decreased rigidity because of the metallic substrate remaining with a decreased percentage.

DETAILED DESCRIPTION OF THE INVENTION

First Embodiment

Figure 1:
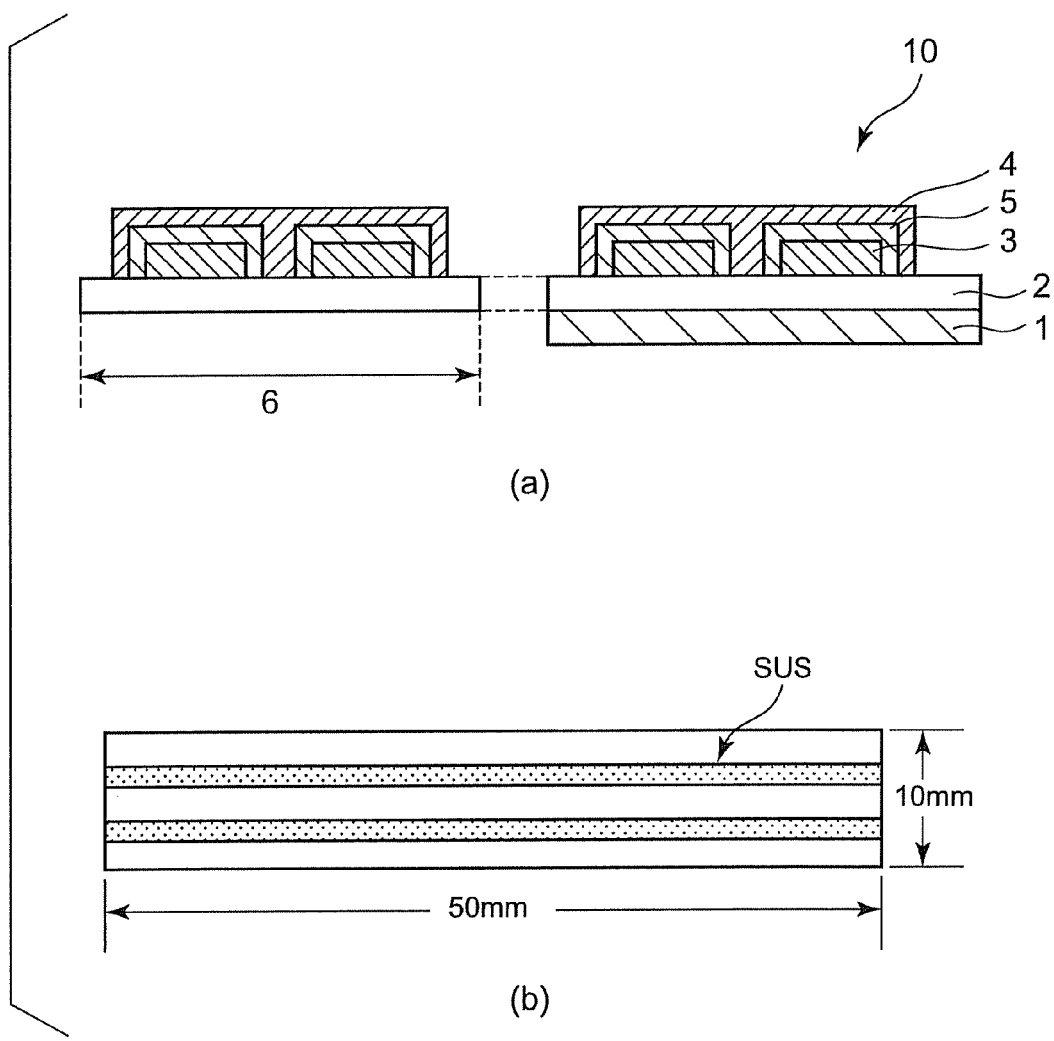
FIG. 1 is a diagrammatic cross-sectional view showing a substrate for suspension according to the first embodiment of the present invention.

The present invention relates to a substrate for suspension and to a process for producing it.

A substrate for suspension and a process for producing it according to the first embodiment of the invention will be hereinafter described in detail.

A. Substrate for Suspension

A substrate for suspension of the present invention comprises a metallic substrate, an insulating layer formed on the metallic substrate from an insulating-layer-forming material, a conductor layer formed on the insulating layer, and a cover layer formed on the insulating layer from a cover-layer-forming material, covering at least a part of the conductor layer. This substrate for suspension has two forms, a form (first form) in which the insulating-layer-forming material and the cover-layer-forming material are different materials and have coefficients of hygroscopic expansion of 0/% RH to $30 \times 10^{-6}$/% RH, and the difference between the coefficients of hygroscopic expansion of the two materials is $5 \times 10^{-6}$/% RH or less; and a form (second form) in which the insulating-layer-forming material and the cover-layer-forming material are the same non-photosensitive material whose coefficient of hygroscopic expansion is in the range between 0/% RH and $30 \times 10^{-6}$/% RH. Each form of the substrate for suspension of the invention will be described below.

1. First Form

The first form of the substrate for suspension of the present invention will be first described. A substrate for suspension in this form is that, in the above-described substrate for suspension, the insulating-layer-forming material and the cover-layer-forming material are different materials and have coefficients of hygroscopic expansion of 0/% RH to $30 \times 10^{-6}$/% RH, the difference between the coefficients of hygroscopic expansion of the two materials being $5 \times 10^{-6}$/% RH or less Such a substrate for suspension in this form will be described with reference to the accompanying drawings. FIG. 1(a) is a diagrammatical cross-sectional view showing an example of the substrate for suspension in this form. A substrate for suspension 10 in this form comprises a metallic substrate 1, an insulating layer 2 formed on the metallic substrate 1, a conductor layer 3 formed on the insulating layer 2, and a cover layer 4 formed on the insulating layer 2, covering at least a part of the conductor layer 3, as illustrated in FIG. 1(a). The conductor layer 3 is covered with a protective deposit 5. In order to obtain a substrate for suspension 10 having decreased rigidity, the metallic substrate 1 is partly removed so that the insulating layer 2 includes a low-rigidity area 6 in which its one side is not covered with the metallic substrate 1.

Figure 10:
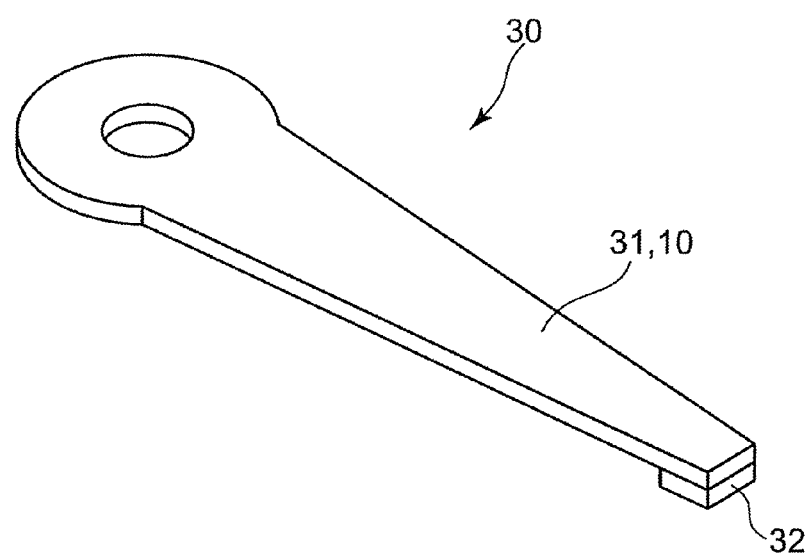
FIG. 10 is a perspective view showing a magnetic head suspension and a hard disk drive.

A magnetic head suspension 31 comprising the substrate for suspension 10, and a magnetic head 32 attached to the end of the magnetic head suspension 31 constitute a hard disk drive 30 (see FIG. 10).

In the substrate for suspension 10, the insulating layer and the cover layer are formed from an insulating-layer-forming material and a cover-layer-forming material, respectively. The two materials are different from each other and have coefficients of hygroscopic expansion of 0/% RH to $30 \times 10^{-6}$/% RH. The difference between the coefficients of hygroscopic expansion of the two materials is $5 \times 10^{-6}$/% RH or less.

A method for determining the coefficient of hygroscopic expansion of a material will be described below.

S-TMA: While keeping the temperature constant at 25° C., the relative humidity was varied from 15% to 20% and to 50%. From the length of a sample measured at 20% RH and that measured at 50% RH, the extension of the sample per 1% RH was calculated and was taken as the coefficient of hygroscopic expansion of the sample.

For this calculation, the following equation was used:

$$\text{coefficient of hygroscopic expansion}[ppm \% RH] =$$
$$(\text{extension per 1\% } RH)/(\text{initial length}) \times 1000000 =$$
$$(\text{difference between length at 20\% } RH \text{ and that at 50\% } RH)/30/$$
$$(\text{initial length}) \times 1000000$$

1) Form of Sample
   size: 5 mm (width)×15 mm (length) (+5 mm for grip)
   thickness: about 7-8 μm
   initial state: well dried
2) Conditions of Measurement
   apparatus: S-TMA (TMA provided with a humidifier) manufactured by RIGAKU Corp., Japan
   loading: 5 g
   temperature: 25° C.
3) Method of Measurement
   1. A sample is left as is for 0.5 hours or more after an atmosphere in which the sample is placed has become steady at 15% RH and the sample has come to undergo no change in length.
   2. The sample is left as is for 0.5 hours or more after the atmosphere in which the sample is placed has become steady at 20% RH and the sample has come to undergo no change in length (the length of the sample is measured).
   3. Subsequently, the sample is left as is for 0.5 hours or more after the atmosphere in which the sample is placed has become steady at 50% RH and the sample has come to undergo no change in length (the length of the sample is measured).
   4. The difference between the length of the sample measured at 20% RH and the one measured at 50% RH is calculated, and the extension per 1% RH is obtained by multiplying the difference in length by 1/30.
   5. The rate of change is obtained by dividing the extension per 1% RH by the initial length of the sample (15 μm).

According to this form, since the coefficient of hygroscopic expansion of the insulating-layer-forming material, that of the cover-layer-forming material, and the difference between the coefficients of hygroscopic expansion of the two materials are in the above-described respective ranges, the substrate for suspension in this form is warped by moisture only a little even when it has decreased rigidity.

The following is the reason why, when the coefficient of hygroscopic expansion of the insulating-layer-forming material, that of the cover-layer-forming material, and the difference between the coefficients of hygroscopic expansion of the two materials are in the above-described respective ranges, the substrate for suspension in this form is warped by moisture only a little even when it has decreased rigidity because of the metallic substrate remaining with a decreased percentage.

Conventionally, the portion of one side of an insulating layer that is covered with a metallic substrate has been large, so that it has been difficult for the insulating layer to absorb moisture. Therefore, even when the insulating layer has a high coefficient of hygroscopic expansion, it scarcely expands hygroscopically, so that it is scarcely warped by hygroscopic expansion. It has thus been possible to suppress, to a certain extent, warping of a substrate for suspension only by making the coefficient of thermal expansion of the metallic substrate nearly equal to that of the insulating layer.

However, when the percentage of the metallic substrate remaining in the substrate for suspension is lowered in order to decrease the rigidity of the substrate for suspension, an increased part of the metallic-substrate-side surface of the insulating layer is not covered with the metallic substrate, so that the insulating layer can readily absorb moisture to expand. Although the conventional metallic substrate has been able to withstand fully to such expansion, the metallic substrate remaining with a lowered percentage for decreasing the rigidity of the substrate for suspension is difficult to withstand the stress caused by hygroscopic expansion of the insulating layer and the cover layer whose coefficients of hygroscopic expansion are high. For this reason, when the coefficient of hygroscopic expansion of the insulating-layer-forming material and that of the cover-layer-forming material are high, the substrate for suspension is warped by the hygroscopic expansion of the two materials.

In this form, on the other hand, since the coefficient of hygroscopic expansion of the material for forming the insulating layer and that of the material for forming the cover layer are in the above-described range, the substrate for suspension is scarcely warped by the hygroscopic expansion of the insulating layer and that of the cover layer even when it has decreased rigidity.

Further, in the conventional substrate for suspension, since the metallic substrate, a high-rigidity material, remains with a high percentage, it has been possible to suppress, to a certain extent, warping of the substrate due to the difference between the hygroscopic expansion of the insulating layer and that of the cover layer, even if the difference between the coefficient of hygroscopic expansion of the insulating-layer-forming material and that of the cover-layer-forming material is great. However, the metallic substrate remaining with a lowered percentage for decreasing the rigidity of the substrate for suspension cannot withstand the stress caused by the difference between the hygroscopic expansion of the insulating-layer-forming material and that of the cover-layer-forming material when the difference between the coefficients of hygroscopic expansion of the two materials is large. This results in warping of the substrate for suspension.

In this form, on the other hand, the difference between the coefficient of hygroscopic expansion of the insulating-layer-forming material and that of the cover-layer-forming material is in the above-described range, so that even when the substrate for suspension has decreased rigidity, it is warped only a little by the difference between the coefficients of hygroscopic expansion of the two materials.

That the insulating-layer-forming material and the cover-layer-forming material are different materials is advantageous in the following respect.

If the insulating-layer-forming material and the cover-layer-forming material are the same material, when a cover-layer-forming layer is formed on the insulating layer that has been formed on the metallic substrate, which will be described later, from the insulating-layer-forming material, and is then dissolved pattern-wise to form a patterned cover layer, the insulating layer may also be dissolved in a solvent with which the cover-layer-forming layer is pattern-wise dissolved. Therefore, before forming pattern-wise the cover layer, the insulating layer is well baked so that it will not be dissolved in a solvent with which the cover layer is dissolved pattern-wise. In the case where the insulating layer is formed pattern-wise after forming the cover layer, since the insulating layer (insulating-layer-forming layer) has been well baked beforehand, it may be difficult to conduct patterning of the insulating layer.

The substrate for suspension is composed of a laminate of the metallic substrate, the insulating layer, the conductor layer and the cover layer, and the adhesion between each two adjacent layers must be strong. For example, the insulating layer is required to be excellent in adhesion to the metallic substrate and to the conductor layer, and the cover layer is required to be excellent in adhesion to the insulating layer and to the conductor layer. If the material for forming the insulating layer and the material for forming the cover layer are the same, it is difficult to fulfill the above requirements at the same time, and the degree of selectivity of materials is very low.

In this form, since the insulating-layer-forming material and the cover-layer-forming material are different materials, a material that never dissolves when the cover layer is formed on it can be used as the insulating-layer-forming material, for example, and it is easy to select a material having the adhesion properties required for the insulating layer and a material having the adhesion properties required for the cover layer. Therefore, the use of different materials as the insulating-layer-forming material and the cover-layer-forming material makes it easier to select, as the insulating-layer-forming material, a material that never dissolves when the cover layer is formed on it, for example.

The substrate for suspension in this form contains at least the metallic substrate, the insulating layer, the conductor layer, and the cover layer.

These components of the substrate for suspension in this form will be hereinafter described in detail.

(1) Insulating Layer 2 and Cover Layer 4

The insulating layer for use in this form is formed on the metallic substrate, which will be described later, from the insulating-layer-forming material.

The cover layer for use in this form is formed on the insulating layer from the cover-layer-forming material so that it partly covers the cover layer that will be described later.

The insulating layer or the cover layer may be formed from a single material, or composed of a laminate of two or more layers of different materials. In the case where the insulating layer or the cover layer is a laminate of layers of different materials, the properties, such as hygroscopic expansibility and linear thermal expansibility, of the whole laminate of two or more layers are taken as the properties of the insulating layer or of the cover layer in the present invention.

In the case where a laminate of [stainless steel plate-insulating layer-copper layer], obtained by laminating, is used to form a suspension, the insulating layer often has a three-layered structure of [adhesive material layer-low-expansibility material layer-adhesive material layer] because materials having low expansibility are usually poor in adhesion properties. Such a laminate of metals and an insulating layer, obtained by laminating, is advantageous in that it can use rolled or alloyed copper, and is characterized by excellent adhesion between the insulating layer and the metal layers. On the other hand, copper foil, which is used from the viewpoint of stability of the laminate, is restricted in thickness, so that it is not easy to make the copper layer thinner.

The above laminate can also be made in the following manner: after forming an insulating layer on a stainless steel-made substrate, a copper layer is formed on the insulating layer by sputtering or plating. In this case, it is possible to form the insulating layer from one type of material and to make the copper layer thinner. However, this manner is at a disadvantage in that only electrolytic copper foil can be used.

(a) Insulating-Layer-Forming Material 2' and Cover-Layer-Forming Material 4'

The insulating-layer-forming material 2' and the cover-layer-forming material 4' for use in this form are different materials and have coefficients of hygroscopic expansion of 0/% RH to $30\times10^{-6}$/% RH. The difference between the coefficients of hygroscopic expansion of the two materials is $5\times10^{-6}$/% RH or less.

That the insulating-layer-forming material and the cover-layer-forming material are different materials herein means that the main polymer chain or substituent group in the former is different in type and amount from the one in the latter, and excludes the case where the two materials are different from each other only in the type and amount of the photopolymerization initiator and other additives, which will be described later, incorporated in the materials.

According to this form, since the coefficient of hygroscopic expansion of the insulating-layer-forming material, that of the cover-layer-forming material, and the difference between the coefficients of hygroscopic expansion of the two materials are in the above-described respective ranges, the substrate for suspension in this form is scarcely warped by moisture even when it has decreased rigidity.

Further, since the insulating-layer-forming material and the cover-layer-forming material are different materials, it is easy to select, for the insulating layer, a material that never dissolves when the cover layer is formed on it, for example.

The insulating-layer-forming material and the cover-layer-forming material can fulfill their purposes as long as they have coefficients of hygroscopic expansion of 0/% RH to $30\times10^{-6}$/% RH. It is particularly preferred that the coefficients of hygroscopic expansion of the two materials be in the range between 0/% RH and $20\times10^{-6}$/% RH, preferably between 0/% RH and $12\times10^{-6}$/% RH.

There are a very few materials useful for the invention that have negative coefficients of hygroscopic expansion, i.e., materials that shrink as they absorb moisture. The range from which such materials can be selected is narrow, so that it is not favorable to use such materials in the invention. Materials having coefficients of hygroscopic expansion in excess of the above range are also unfavorable, because a substrate for suspension produced by using such materials warps greatly.

The coefficient of hygroscopic expansion is the rate of change in the length of a material to change in relative humidity. The length of a material herein refers to the length of a material placed in an atmosphere at a certain relative humidity, measured after the moisture content of the material has reached the equilibrium moisture content at the relative humidity. The rate of change in the length of a material refers to a value obtained by dividing a change in the length of a material due to change in relative humidity (the value obtained by subtracting the length of the material measured after the relative humidity has been varied, from the length of the material measured before the relative humidity is varied) by the total length of the material.

That a material has a positive coefficient of hygroscopic expansion means that the length of the material increases as the relative humidity increases. That a material has a negative coefficient of hygroscopic expansion means that the length of the material decreases as the relative humidity increases.

The insulating-layer-forming material and the cover-layer-forming material can fulfill their purposes when the difference between their coefficients of hygroscopic expansion is $5\times10^{-6}$/% RH or less. It is particularly preferred that the difference between the coefficients of hygroscopic expansion of the two materials be $4\times10^{-6}$/% RH or less, preferably $3\times10^{-6}$/% RH or less. This is because when the difference is in the above range, the substrate for suspension in this form is warped by moisture only a little even when it has decreased rigidity.

The difference between the coefficient of hygroscopic expansion of the insulating-layer-forming material and that of the cover-layer-forming material is the absolute value of the difference between the coefficients of hygroscopic expansion of the two materials.

It is preferred that the coefficients of water absorption of the insulating-layer-forming material and the cover-layer-forming material for use in this form be in the range between 0.01% and 2.5%, preferably between 0.1% and 1.5%. This is because the insulating-layer-forming material and the cover-layer-forming material whose coefficients of water absorption are in the above range can make the water absorption of the insulating layer and that of the cover layer low, and can thus suppress hygroscopic expansion of these layers. Therefore, even when the percentage of the remaining metallic substrate, which will be described later, is lowered in order to decrease the rigidity of the substrate for suspension in this form, the substrate for suspension warps only a little. Further, when the insulating-layer-forming material and the cover-layer-forming material have coefficients of water absorption lower than the above range, there may be obtained only poor adhesion between the cover layer and the insulating layer. On the other hand, when the two materials have coefficients of water absorption in excess of the above range, the substrate for suspension is greatly warped by moisture.

The coefficient of water absorption herein refers to the rate of change in weight of the insulating-layer-forming material or of the cover-layer-forming material, obtained by the Karl Fischer method from the weight of the material measured after the percentage of water absorption of the material has reached the saturated moisture content and from the weight of the material measured when it is dry. In this method, the percentage of water absorption of a material measured after the material has been left in an atmosphere at 85° C. and 85% RH for one hour to allow it to absorb water is taken as the saturated moisture content. Specifically, the coefficient of water absorption of a material is the value obtained by dividing, by the weight of the material measured when the material is dry, the difference between the weight of the material measured after the percentage of water absorption of the material has reached the saturated moisture content and the weight of the material measured when the material is dry.

The insulating-layer-forming material and the cover-layer-forming material for use in this form can have any coefficient of thermal expansion, as long as the substrate for suspension is warped only a little by the difference between the coefficient of thermal expansion of the metallic substrate that will be described later and those of the insulating-layer-forming material and the cover-layer-forming material. It is however preferred that the coefficients of thermal expansion of the two materials be in the range between $15 \times 10^{-6}/°$ C. and $30 \times 10^{-6}/°$ C., preferably between $15 \times 10^{-6}/°$ C. and $25 \times 10^{-6}/°$ C., more preferably between $15 \times 10^{-6}/°$ C. and $20 \times 10^{-6}/°$ C. This is because when the coefficients of thermal expansion of the two materials are in the above range, the substrate for suspension in this form is warped scarcely by temperature change even when it has decreased rigidity.

The coefficient of thermal expansion herein refers to the rate of change in the length of a material to change in temperature. The length of a material is the length of the material measured after the material has reached a certain temperature. The rate of change in the length of a material is the value obtained by dividing the difference between the length of the material measured when the material is at a certain temperature and the length of the material measured after the material has reached another temperature (the value obtained by subtracting the length of the material before the temperature is varied from the length of the material after the temperature has been varied) by the total length of the material.

That the coefficient of thermal expansion of a material is positive means that the length of the material increases as the temperature of the material increases. That the coefficient of thermal expansion of a material is negative means that the length of the material decreases as the temperature of the material increases.

The difference between the coefficients of thermal expansion of the insulating-layer-forming material and the cover-layer-forming material for use in this form is preferably $10 \times 10^{-6}/°$ C. or less, more preferably $5 \times 10^{-6}/°$ C. or less. This is because when the difference between the coefficients of thermal expansion of the two materials is in the above range, the substrate for suspension in this from is scarcely warped by temperature change even when it has decreased rigidity.

The difference between the coefficients of thermal expansion of the insulating-layer-forming material and the cover-layer-forming material is the absolute value of the difference between the coefficient of thermal expansion of the insulating-layer-forming material and that of the cover-layer-forming material.

Any material can be used in this form as the insulating-layer-forming material or the cover-layer-forming material as long as it has a coefficient of hygroscopic expansion in the above-described range and has insulating properties. The material may be either photosensitive or non-photosensitive. In this form, it is particularly preferred that the insulating-layer-forming material and the cover-layer-forming material be non-photosensitive.

The term "non-photosensitive material" herein refers to a material that cannot be patterned by the action of light when it contains no additives and that must be patterned in the following manner. Unnecessary portions of a layer of the material are removed by applying a liquid, gas or plasma to the layer through openings in a metal- or resist-made mask placed on the layer; or the material is applied pattern-wise by such a technique as ink-jet printing or screen process printing.

More generally, the term "non-photosensitive material" refers to a material that forms a pattern although it contains no photosensitive component.

The use of a non-photosensitive material makes the process of pattern formation complicated, but makes it possible to use a purer material containing no photosensitive component. This is advantageous in that the material can be selected from a wider range. It is thus possible to use a material having both low hygroscopic expansibility and low linear thermal expansibility, which are the characteristics essential in the present invention.

To make the insulating-layer-forming material and the cover-layer-forming material photosensitive, it is necessary to follow the following procedure. A photosensitive insulating material obtained by introducing a photosensitive group in the molecular skeleton of a non-photosensitive insulating material that will be described later is polymerized in the presence of a photopolymerization initiator. Alternatively, besides the above-described non-photosensitive or photosensitive insulating material, a photosensitive monomer is added to the insulating-layer-forming material and to the cover-layer-forming material and is polymerized in the presence of a photopolymerization initiator, or a photosensitizer whose solubility can be changed by the action of light is added to the two materials. Therefore, even after the insulating-layer-forming material and the cover-layer-forming material have been subjected to post-processing, e.g., heating, the photosensitizing component or its decomposed residues can remain in the materials to increase the coefficients of hygroscopic expansion of the materials or to make it extremely hard to make the adhesion properties of the materials appropriate.

Photosensitive polyimide resins (PI) usually used as photosensitive insulating materials require the use of a high-boiling-point solvent, such as γ-butyrolactone, N-methyl-pyrrolidone, or dimethylacetamide, as a developing solvent and thus takes time for drying. Further, these developing solvents for photosensitive polyimide resins are expensive and, moreover, require explosion-proof facilities for development, so that they are highly disadvantageous from the viewpoint of production costs. Another problem with the above developing solvents for photosensitive polyimide resins is that they may damage the photosensitive polyimide resins themselves.

On the other hand, when the insulating-layer-forming material and the cover-layer-forming material are non-photosensitive, the above-described introduction of a photosensitive group in, or addition of other additives to, a non-photosensitive insulating material is not necessary, so that it is easy to control the coefficients of hygroscopic expansion of the materials, etc. Further, an organic or inorganic alkali can be used to develop the materials, and, moreover, it is not necessary to use explosion-proof facilities. Therefore, the insulating layer and the cover layer can be formed at low costs, and, moreover, they are hardly damaged.

When the insulating-layer-forming material and the cover-layer-forming material for use in this form are non-photosensitive, they usually have non-photosensitive insulating properties.

Examples of non-photosensitive insulating materials useful herein include synthetic resins such as polyimide resins, acrylic resins, polyether nitrile resins, polyether sulfone resins, polyethylene terephthalate resins, polyethylene naphthalate resins, and polyvinyl chloride resins. Of these, polyimide resins are preferred, since they are excellent in insulating properties, heat resistance, and chemical resistance.

When the insulating-layer-forming material and the cover-layer-forming material for use in this form are photosensitive, they usually contain photosensitive insulating materials obtained by introducing photosensitive groups into the above-described non-photosensitive insulating materials, or polymers of photosensitive monomers.

Examples of the photosensitive insulating materials useful herein include photosensitive synthetic resins such as photosensitive polyimide resins, photosensitive acrylic resins, photosensitive polyether nitrile resins, photosensitive polyether sulfone resins, photosensitive polyethylene terephthalate resins, photosensitive polyethylene naphthalate resins, and photosensitive polyvinyl chloride resins. Of these, photosensitive polyimide resins are preferred, since they are excellent in insulating properties, heat resistance, and chemical resistance.

Examples of the above-described photosensitive group, photosensitive monomer and photopolymerization initiator include those ones that are commonly used to form an insulating layer and a cover layer, components of a substrate for suspension, via exposure and development.

The insulating-layer-forming material and the cover-layer-forming material for use in this form can contain additives such as sensitizers, terminators, chain transfer agents, leveling agents, plasticizers, surface-active agents, and anti-foaming agents, as needed.

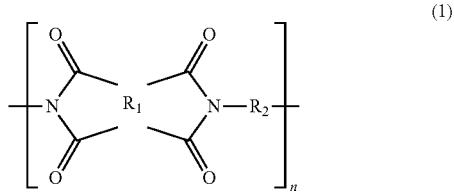

(1)

wherein $R_1$ is a tetravalent organic group, $R_2$ is a divalent organic group, $R_1$ and $R_2$ being either a single structure or a combination of two or more structures, and n is a natural number of 1 or more.

In the above formula (1), $R_1$ is a structure derived from tetracarboxylic dianhydride, and $R_2$ is a structure derived from diamine.

Examples of acid dianhydrides useful for polyimides to be used in the present invention include ethylene tetracarboxylic dianhydride, butane tetracarboxylic dianhydride, cyclobutane tetracarboxylic dianhydride, cyclopentane tetracarboxylic dianhydride, pyromellitic dianhydride, 3,3',4,4'-benzophenone tetracarboxylic dianhydride, 2,2',3,3'-benzophenone tetracarboxylic dianhydride, 3,3',4,4'-biphenyltetracarboxylic dianhydride, 2,2',3,3'-biphenyltetracarboxylic dianhydride, 2,2',6,6'-biphenyltetracarboxylic dianhydride, 2,2-bis(3,4-dicarboxyphenyl)propane dianhydride, 2,2-bis(2,3-dicarboxyphenyl)-propane dianhydride, bis(3,4-dicarboxyphenyl)ether dianhydride, bis(3,4-dicarboxyphenyl)sulfonic dianhydride, 1,1-bis(2,3-dicarboxyphenyl)-ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoropropane dianhydride, 2,2-bis(2,3-dicarboxyphenyl)-1,1,1,3,3,3-hexafluoropropane dianhydride, 1,3-bis[(3,4-dicarboxy)benzoyl]benzene dianhydride, 1,4-bis[(3,4-dicarboxy)benzoyl]benzene dianhydride, 2,2-bis{4-[4-(1,2-dicarboxy)-phenoxy]phenyl}propane dianhydride, 2,2-bis{4-[3-(1,2-dicarboxy)-phenoxy]phenyl}propane dianhydride, bis{4-[4-(1,2-dicarboxyl)phenoxy]-phenyl}ketone dianhydride, bis{4-[3-(1,2-dicarboxyl)phenoxy]-phenyl}ketone dianhydride, 4,4'-bis[4-(1,2-dicarboxyl)phenoxy]biphenyl dianhydride, 4,4'-bis[3-(1,2-dicarboxyl)phenoxy]biphenyl dianhydride, bis{4-[4-(1,2-dicarboxyl)phenoxy]phenyl}ketone dianhydride, bis{4-[3-(1,2-dicarboxyl)phenoxy]phenyl}ketone dianhydride, bis{4-[4-(1,2-dicarboxyl)phenoxy]phenyl}sulfone dianhydride, bis{4-[3-(1,2-dicarboxyl)phenoxy]phenyl}sulfone dianhydride, bis{4-[4-(1,2-dicarboxyl)phenoxy]phenyl}sulfide dianhydride, bis{4-[3-(1,2-dicarboxyl)phenoxy]phenyl}sulfide dianhydride, 2,2-bis{4-[4-(1,2-dicarboxyl)phenoxy]phenyl}-1,1,1,3,3,3-hexafluoropropane dianhydride, 2,2-bis{4-[3-(1,2-dicarboxyl)phenoxy]phenyl}-1,1,1,3,3,3-propane dianhydride, 2,3,6,7-naphthalene tetracarboxylic dianhydride, 1,4,5,8-naphthalene tetracarboxylic dianhydride, 1,2,5,6-naphthalene tetracarboxylic dianhydride, 1,2,3,4-benzene tetracarboxylic dianhydride, 3,4,9,10-perylene tetracarboxylic dianhydride, 2,3,6,7-anthracene tetracarboxylic dianhydride, and 1,2,7,8-phenanethrene tetracarboxylic dianhydride.

The above-enumerated compounds are used singly. Alternatively, two or more of the above compounds may be used in combination.

Tetracarboxylic dianhydrides that are favorably used from the viewpoint of the properties of polyimides to be used in the present invention, such as heat resistance and coefficient of linear thermal expansion, are preferably aromatic tetracarboxylic anhydrides. Examples of particularly favorable tetracarboxylic dianhydrides include pyromellitic dianhydride, mellophanic dianhydride, 3,3',4,4'-benzophenone tetracarboxylic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, 2,2',6,6'-biphenyltetracarboxylic dianhydride, bis(3,4-dicarboxyphenyl)ether dianhydride, 2,2-bis(3,4-dicarboxyphenyl)-1,1,1,3,3,3-hexafluoropropane dianhydride, and bis(3,4-dicarboxyphenyl)ether dianhydride.

Of the above-enumerated tetracarboxylic dianhydrides, 3,3',4,4'-biphenyltetracarboxylic dianhydride, 2,3,3',4'-biphenyltetracarboxylic dianhydride, 2,3,2',3'-biphenyltetracarboxylic dianhydride, and bis(3,4-dicarboxyphenyl)ether dianhydride are particularly preferred from the viewpoint of reduction in hygroscopic expansion.

When an acid dianhydride containing fluorine is co-used, the coefficient of hygroscopic expansion of the polyimide lowers. However, a polyimide's precursor having a fluorine-containing skeleton is not readily dissolved in a basic aqueous solution, so that it is necessary to use a mixture of an organic solvent, e.g., an alcohol, and a basic aqueous solution to develop such a precursor.

It is preferable to use an acid dianhydride having a stiff skeleton, such as pyromellitic dianhydride, mellophanic dianhydride, 3,3',4,4'-biphenyltetracarboxylic dianhydride, 2,3,3',4'-biphenyltetracarboxylic dianhydride, 2,3,2',3'-biphenyltetracarboxylic dianhydride, or 1,4,5,8-naphthalene tetracarboxylic dianhydride. This is because when such an acid dianhydride is used, the resulting polyimide has a low coefficient of linear thermal expansion. Of these acid dianhydrides, 3,3',4,4'-biphenyltetracarboxylic dianhydride, 2,3,3',4'-biphenyltetracarboxylic dianhydride, and 2,3,2',3'-biphenyltetracarboxylic dianhydride are particularly preferred from the viewpoint of a balance of coefficient of linear expansion and coefficient of hygroscopic expansion.

When the acid dianhydride has an alicyclic skeleton, the precursor of the polyimide has enhanced photosensitivity, so that there can be obtained a highly photosensitive resin composition. However, the polyimide produced from the precursor tends to be inferior to aromatic polyimides in heat resistance and insulating properties.

The use of an aromatic tetracarboxylic dianhydride is advantageous in that there can be obtained a polyimide having high heat resistance and a low coefficient of linear thermal expansion. Therefore, in the photosensitive resin composition in the invention, it is preferred that 33 mol % or more of $R_1$ in the above formula (1) is a group represented by the following formula (2):

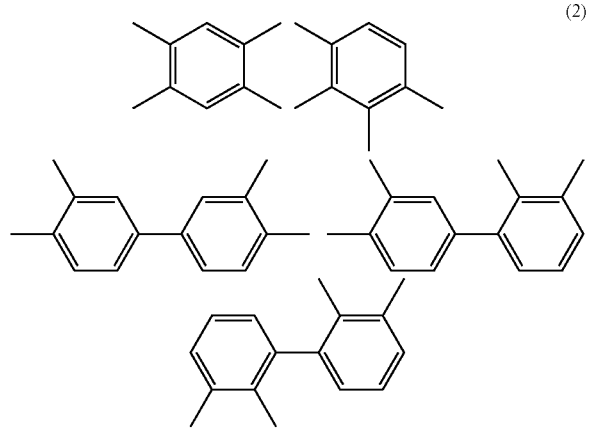

(2)

A polyimide containing the above group has high heat resistance and a low coefficient of linear thermal expansion. When the percentage of the group represented by the formula (2) is closer to 100 mol % of $R_1$ in the formula (1), the object of the present invention can be fulfilled more easily. When the percentage of the group represented by the formula (2) is at least 33 mol % of $R_1$ in the formula (1), the object of the invention can be fulfilled. It is preferred that the group represented by the formula (2) be at least 50 mol %, preferably at least 70 mol %, of $R_1$ in the formula (1).

A single diamine or a combination of two or more diamines can be used as the diamine component of the polyimide to be used in the present invention. Any diamine component can be used in the present invention. Examples of diamines herein useful include p-phenylene diamine, m-phenylene diamine, o-phenylene diamine, 3,3'-diaminodiphenyl ether, 3,4'-diaminodiphenyl ether, 4,4'-diaminodiphenyl ether, 3,3'-diaminodiphenyl sulfide, 3,4'-diaminodiphenyl sulfide, 4,4'-diaminodiphenyl sulfide, 3,3'-diaminodiphenylsulfone, 3,4'-diaminodiphenylsulfone, 4,4'-diaminodiphenylsulfone, 3,3'-diaminobenzophenone, 4,4'-diaminobenzophenone, 3,4'-diaminobenzophenone, 3,3'-diaminodiphenylmethane, 4,4'-diaminodiphenylmethane, 3,4'-diaminodiphenylmethane, 2,2-di(3-aminophenyl)propane, 2,2-di(4-aminophenyl)propane, 2-(3-aminophenyl)-2-(4-aminophenyl)propane, 2,2-di(3-aminophenyl)-1,1,1,3,3,3-hexafluoropropane, 2,2-di(4-aminophenyl)-1,1,1,3,3,3-hexafluoropropane, 2-(3-aminophenyl)-2-(4-aminophenyl)-1,1,1,3,3,3-hexafluoropropane, 1,1-di(3-aminophenyl)-1-phenylethane, 1,1-di(4-aminophenyl)-1-phenylethane, 1-(3-aminophenyl)-1-(4-aminophenyl)-1-phenylethane, 1,3-bis(3-aminophenoxy)benzene, 1,3-bis(4-aminophenoxy)benzene, 1,4-bis(3-aminophenoxy)benzene, 1,4-bis(4-aminophenoxy)benzene, 1,3-bis(3-aminobenzoyl)benzene, 1,3-bis(4-aminobenzoyl)benzene, 1,4-bis(3-aminobenzoyl)benzene, 1,4-bis(4-aminobenzoyl)benzene, 1,3-bis(3-amino-α,α-dimethylbenzyl)benzene, 1,3-bis(4-amino-α,α-dimethylbenzyl)benzene, 1,4-bis(3-amino-α,α-dimethylbenzyl)benzene, 1,4-bis(4-amino-α,α-dimethylbenzyl)benzene, 1,3-bis(3-amino-α,α-ditrifluoromethylbenzyl)benzene, 1,3-bis(4-amino-α,α-ditrifluoromethylbenzyl)benzene, 1,4-bis(3-amino-α,α-ditrifluoromethylbenzyl)benzene, 1,4-bis(4-amino-α,α-ditrifluoromethyl-benzyl)benzene, 2,6-bis(3-aminophenoxy)benzonitrile, 2,6-bis(3-aminophenoxy)pyridine, 4,4'-bis(3-aminophenoxy)biphenyl, 4,4'-bis(4-aminophenoxy)biphenyl, bis[4-(3-aminophenoxy)phenyl]ketone, bis[4-(4-aminophenoxy)phenyl]ketone, bis[4-(3-aminophenoxyl)phenyl]sulfide, bis[4-(4-aminophenoxyl)phenyl]sulfide, bis[4-(3-aminophenoxyl)phenyl]-sulfone, bis[4-(4-aminophenoxyl)phenyl]sulfone, bis[4-(3-aminophenoxy)-phenyl]ether, bis[4-(4-aminophenoxyl)phenyl]ether, 2,2-bis[4-(3-aminophenoxyl)phenyl]propane, 2,2-bis[4-(4-aminophenoxy)phenyl]-propane, 2,2-bis[3-(3-aminophenoxy)phenyl]-1,1,1,3,3,3-hexafluoro-propane, 2,2-bis[4-(4-aminophenoxy)phenyl]-1,1,1,3,3,3-hexafluoropropane, 1,3-bis[4-(3-aminophenoxy)benzoyl]benzene, 1,3-bis[4-(4-aminophenoxy)benzoyl]benzene, 1,4-bis[4-(3-aminophenoxy)benzoyl]-benzene, 1,4-bis[4-(4-aminophenoxy)benzoyl]benzene, 1,3-bis[4-(3-aminophenoxy)-α,α-dimethylbenzyl]benzene, 1,3-bis[4-(4-aminophenoxy)-α,α-dimethylbenzyl]benzene, 1,4-bis[4-(3-aminophenoxy)-α,α-dimethylbenzyl]benzene, 1,4-bis[4-(4-aminophenoxy)-α,α-dimethylbenzyl]benzene, 4,4'-bis[4-(4-aminophenoxyl)benzoyl]diphenyl ether, 4,4'-bis[4-(4-amino-α,α-dimethylbenzyl)phenoxy]benzophenone, 4,4'-bis[4-(4-amino-α,α-dimethylbenzyl)phenoxy]diphenylsulfone, 4,4'-bis[4-(4-aminophenoxy)-phenoxy]diphenylsulfone, 3,3'-diamino-4,4'-diphenoxybenzophenone, 3,3'-diamino-4,4'-dibiphenoxybenzophenone, 3,3'-diamino-4-phenoxybenzophenone, 3,3'-diamino-4-biphenoxybenzophenone, 6,6'-bis(3-aminophenoxy)-3,3,3',3'-tetramethyl-1,1'-spirobiindane, 6,6'-bis(4-aminophenoxy)-3,3,3',3'-tetramethyl-1,1'-spirobiindane, 1,3-bis(3-aminopropyl)tetramethyldisiloxane, 1,3-bis(4-aminobutyl)tetramethyl-disiloxane, α,ω-bis(3-aminopropyl)polydimethylsiloxane, α,ω-bis(3-aminobutyl)polydimethylsiloxane, bis(aminomethyl)ether, bis(2-aminoethyl)ether, bis(3-aminopropyl)ether, bis[(2-aminomethoxy)-ethyl]ether, bis[2-(2-aminoethoxyl)ethyl]ether, bis[2-(3-aminoprotoxy)ethyl]ether, 1,2-bis(aminomethoxy)ethane, 1,2-bis(2-aminoethoxy)ethane, 1,2-bis[(2-aminomethoxy)ethoxy]ethane, 1,2-bis[2-(2-aminoethoxy)ethoxy]ethane, ethylene glycol bis(3-aminopropyl)ether, diethylene glycol bis(3-aminopropyl)ether, triethylene glycol bis(3-aminopropyl)ether, ethylenediamine, 1,3-diaminopropane, 1,4-diaminobutane, 1,5-diaminopentane, 1,6-diaminohexane, 1,7-diaminoheptane, 1,8-diaminoctane, 1,9-diaminononane, 1,10-diaminodecane, 1,11-diaminoundecane, 1,12-diaminododecane, 1,2-diaminocyclohexane, 1,3-diaminocyclohexane, 1,4-diaminocylohexane, 1,2-di(2-aminoethyl)cyclohexane, 1,3-di(2-aminoethyl)cyclohexane, 1,4-di(2-aminoethyl)cyclohexane, bis(4-aminocyclohexyl)methane, 2,6-bis(aminomethyl)bicyclo[2.2.1]heptane, and 2,5-bis(aminomethyl)-bicyclo[2.2.1]heptane, as well as a diamine obtained by replacing some or all of the hydrogen atoms on the aromatic rings in any of the above-enumerated diamines with substituting groups selected from fluoro group, methyl group, methoxy group, trifluoromethyl group and trifluoromethoxy group.

Further, depending on the purpose, one, or two or more crosslinking groups selected from ethynyl group, benzocyclobutene-4'-yl group, vinyl group, allyl group, cyano group, isocyanate group and isopropenyl group may be introduced as a substituent/substituents to some or all of the hydrogen atoms on the aromatic ring(s) in any of the above-enumerated diamines.

The diamine can be selected according to the intended physical properties. When such a stiff diamine as p-phenylenediamine is used, the polyimide finally obtained has low expansibility. Examples of stiff diamines containing two amino groups bonded to one aromatic ring include p-phenylenediamine, m-phenylenediamine, 1,4-diamino-naphthalene, 1,5-diaminonaphthalene, 2,6-diaminonaphthalene, 2,7-diaminonaphthalene, and 1,4-diaminoanthracene.

Other useful diamines are those ones containing two or more aromatic rings bonded with single bond, and two or more amino groups bonded to each aromatic ring directly or as a part of a substituent group, for example, diamines represented by the following formula (3):

(3)

wherein a is 0 or a natural number of 1 or more, the amino groups being bonded to the meta- or para-position relative to the bonding of the two benzene rings. Examples of such diamines are specifically benzidine.

Diamines represented by the above formula (3) in which substituent groups exist on the benzene rings in positions other than the positions of the amino substituent groups, without taking part in the bonding to the other benzene ring, can also be used herein. Such substituent groups are monovalent organic groups, and they may be bonded to each other.

Specific examples of such diamines useful herein include 2,2'-dimethyl-4,4'-diaminobiphenyl, 2,2'-ditrifluoromethyl-4,4'-diaminobiphenyl, 3,3'-dichloro-4,4'-diaminobiphenyl, 3,3'-dimethoxy-4,4'-diaminobiphenyl, and 3,3'-dimethyl-4,4'-diaminobiphenyl.

It is possible to lower the coefficient of hygroscopic expansion of the polyimide by introducing fluorine into the aromatic rings as a substituent. However, a fluorine-containing precursor of the polyimide, especially polyamic acid, is not readily dissolved in a basic aqueous solution, and it is sometimes necessary to use a solution containing an organic solvent, e.g., an alcohol, to develop such a precursor.

On the other hand, if a diamine having siloxane skeleton, such as 1,3-bis(3-aminopropyl)tetramethyldisiloxane, is used, improved adhesion to a substrate can be obtained, and the polyimide finally obtained can have lower modulus of elasticity and a lower glass transition temperature.

Although it is preferable to select an aromatic diamine from the viewpoint of heat resistance, a non-aromatic diamine, such as an aliphatic or siloxane diamine, may be co-used in an amount of not more than 60 mol %, preferably not more than 40 mol %, of the total amount of the diamine, depending on the intended physical properties.

In the above-described polyimide, it is preferred that 33 mol % or more of $R_2$ in the above formula (1) be a group represented by the following formula (4):

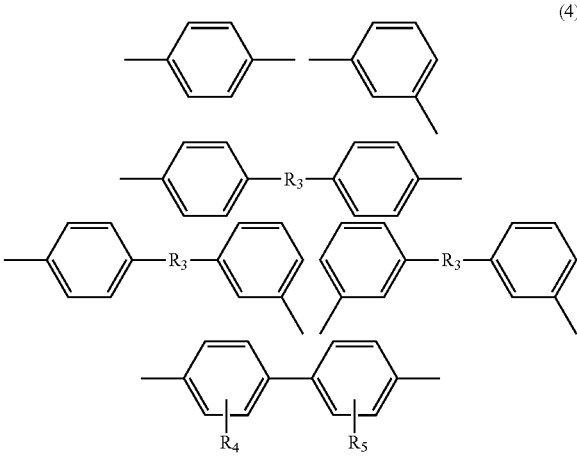

(4)

wherein $R_3$ is a divalent organic group, oxygen atom, sulfur atom, or sulfone group, and $R_4$ and $R_5$ are a monovalent organic group or a halogen atom.

A polyimide containing the above group has improved thermal resistance and a lower coefficient of linear thermal expansion. When the percentage of the group represented by the formula (4) is closer to 100 mol % of $R_2$ in the formula (1), the object of the present invention can be fulfilled more easily. When the percentage of the group represented by the formula (4) is at least 33 mol % of $R_2$ in the formula (1), the object of the invention can be fulfilled. It is preferred that the group represented by the formula (4) be at least 50 mol %, preferably at least 70 mol %, of $R_2$ in the formula (1).

The above-described polyimide can be used in combination with an adhesive polyimide or the like, as needed, to form the insulating layer and the cover layer in the present invention.

A known technique can be used to make the above-described polyimide into a photosensitive one. Non-limitative examples of techniques useful herein include a technique in which a polyimide's precursor obtained by introducing, with ester linkage or ionic bonding, ethylenic double bond to carboxyl group in polyamic acid is mixed with a photo-radical initiator to give a negative photosensitive polyimide of solvent development type; a technique in which naphthoquinone diazide compound is added to polyamic acid or its partially esterified compound to give a positive photosensitive polyimide of alkali development type; and a technique in which niphedipine compound is added to polyamic acid to give a negative photosensitive polyimide of alkali development type.

Any of these photosensitive polyimides contains a photosensitizing component in an amount of 15% to 35% of the weight of the polyimide. Therefore, even if the polyimide is heated at a temperature between 300° C. and 400° C. after the step of pattern formation, the residues of the photosensitizing component remain in the polyimide. These residues increase the coefficient of linear expansion and coefficient of hygroscopic expansion of the polyimide. For this reason, it is not preferable to use a photosensitive polyimide in the present invention.

Either of, or both of, the precursor of the insulating-layer-forming material and the precursor of the cover-layer-forming material can be developed with a basic aqueous solution. The basic aqueous solution is preferably an aqueous solution having a pH of 8 or more, containing less than 20% by weight of an organic solvent, more preferably an aqueous solution having a pH of 8 or more, containing no organic solvent. The basic aqueous solution can contain any basic material selected from known organic or inorganic basic materials. It is however preferable to use, as the basic material, tetramethyl ammonium hydroxide when ionic residues that remain in a pattern after development and the reliability of insulating properties are taken into consideration.

(b) Insulating Layer 2

The insulating layer for use in this form can have any thickness as long as it can exhibit the desired insulating properties. Fort example, the thickness of the insulating layer is preferably from 5 µm to 30 µm, more preferably from 5 µm to 18 µm, most preferably from 5 µm to 12 µm. When the thickness of the insulating layer is less than 5 µm, insulating properties may not be fully obtained. When the thickness of the insulating layer is in excess of the above range, it is hard to obtain a substrate for suspension having decreased rigidity.

The metallic-substrate-covered part (the area other than the low-rigidity area) makes up any percentage of the lower side of the insulating layer for use in this form, as long as there can be obtained a substrate for suspension that warps only a little. Specifically, the percentage of such a part is preferably from 30% to 70%, more preferably from 40% to 70%, of the entire surface of the insulating layer. When this percentage is in the above range, the substrate for suspension in this form can have decreased rigidity, and this form can thus exhibit its effects more satisfactorily.

The percentage of the remaining insulating layer herein refers to the proportion of the portion of the insulating layer that can be seen in a plane view, to the whole area of the substrate for suspension in a plane view. The whole area of the substrate for suspension in a plane view means the area surrounded by the perimeter of the substrate for suspension, and, when through holes are present in the substrate for suspension, it also includes the areas of the through holes in a plane view.

(c) Cover Layer 4

The cover layer for use in this form can have any thickness as long as it covers at least a part of the conductor layer that will be described later. For example, the thickness of the cover layer is preferably 3 to 30 µm, more preferably 3 to 15 µm, most preferably 3 to 10 µm. This is because a cover layer with a thickness lower than the above range cannot fully cover the conductor layer to protect it from corrosion, etc., and because, with a cover layer having a thickness in excess of the above range, it is difficult to obtain a substrate for suspension having decreased rigidity.

(2) Metallic Substrate 1

The metallic substrate for use in this form has electrical conductivity. Moreover, it usually has a moderate degree of springness because it constitutes a substrate to be used for a suspension.

Examples of materials useful for the metallic substrate include SUS.

In this form, the metallic substrate has an electrically conductive layer on the side on which a grounding terminal will be formed. When such a conductive layer is present, the grounding terminal can produce continuity more efficiently. Specific examples of materials useful for the electrically conductive layer include copper (Cu). The electrically conductive layer can be formed by a variety of techniques including plating.

The metallic substrate can have any thickness as long as it can exhibit the desired degree of springness. The thickness of the metallic substrate is usually from 10 µm to 30 µm, preferably from 15 µm to 25 µm, although it depends on the material for the metallic substrate, and so forth. When the metallic substrate is too thin, it may have decreased mechanical strength, while when the metallic substrate is too thick, it is difficult to obtain a substrate for suspension having decreased density.

The metallic substrate can be left with any percentage as long as there can be obtained a substrate for suspension that warps only a little. Specifically, the percentage of the remaining metallic substrate is preferably from 30 to 100%, more preferably from 30 to 60%. This is because when the percentage of the remaining metallic substrate is in the above range, the substrate for suspension in this form can have sufficiently decreased rigidity, and this form can thus exhibit its effects more satisfactorily.

The percentage of the remaining metallic substrate herein refers to the proportion of the area of the metallic substrate that can be seen in a plane view, to the whole area of the substrate for suspension in a plane view. The whole area of the substrate for suspension in a plane view means the area surrounded by the perimeter of the substrate for suspension, and, when through holes are present in the substrate for suspension, it also includes the areas of the through holes in a plane view.

(3) Conductor Layer 3

The conductor layer for use in this form is formed on the above-described insulating layer. When the substrate for suspension in this form is used in an HDD, the conductor layer transmits electrical signals of the data that will be written in a disk, or have been read out from a disk, with a slider.

Examples of materials useful for the conductor layer for use in this form include copper (Cu: rolled copper, electrolytic copper).

The conductor layer for use in this form can have any thickness as long as it can exhibit the desired electrical conductivity. The thickness of the conductor layer is usually from 6 µm to 18 µm, preferably from 8 µm to 12 µm. This is because when the thickness of the conductor layer is in the above range, the substrate for suspension in this form can have decreased rigidity.

The conductor layer can have lines with any width as long as it can exhibit the desired electrical conductivity. The line width is usually from 10 µm to 100 µm, preferably from 15 µm to 50 µm. This is because when the line width is in the above range, the substrate for suspension in this form can have decreased rigidity.

Preferably, the conductor layer for use in this form has, on its surface, a protective deposit of nickel (Ni) or gold (Au). This is because such a protective deposit can make the conductor layer resistant to corrosion.

The thickness of the protective deposit is preferably 5 µm or less, more preferably in the range between 1 µm and 2 µm.

(4) Substrate for Suspension 10

Any process can be employed to produce the substrate for suspension in this form, as long as the metallic substrate, the insulating layer, the conductor layer, and the cover layer can be laminated with high accuracy and with good adhesion, and a conventional process for producing a substrate for suspension can be used. Specifically, a process that will be described later in the item "B. Process for Producing Substrate for Suspension" can be used.

(5) Uses

The substrate for suspension in this form can be used, for example, for a magnetic head suspension in a hard disk drive (HDD). In particular, it is favorably used for a magnetic head suspension for an HDD, which is required to warp only a little even when it has decreased rigidity.

2. Second Form

The second form of the substrate for suspension of the present invention will be described hereinafter. A substrate for suspension in this form is equivalent to the above-described substrate for suspension in which the insulating-layer-forming material and the cover-layer-forming material are the same non-photosensitive material and the coefficients of hygroscopic expansion of the two materials are in the range between 0/% RH and $30 \times 10^{-6}$/% RH.

The substrate for suspension in this form can have a cross section as shown in FIG. 1 whose explanation has been given already.

The insulating-layer-forming material and the cover-layer-forming material for forming the above-described insulating layer 2 and cover layer 4, respectively, are the same non-photosensitive material, and the coefficients of hygroscopic expansion of the two materials are in the range between 0/% RH and $30 \times 10^{-6}$/% RH.

According to this form, since the coefficient of hygroscopic expansion of the non-photosensitive material that is used as the insulating-layer-forming material and as the cover-layer-forming material is in the above range, the substrate for suspension in this form warps only a little even when it has decreased rigidity.

Further, since the insulating-layer-forming material and the cover-layer-forming material are the same non-photosensitive material, there is no difference between the physical property values, such as coefficient of hygroscopic expansion, of the two materials. Furthermore, warping never results from the difference between the hygroscopic expansion of the insulating layer formed from the insulating-layer-forming material and that of the cover layer formed from the cover-layer-forming material, since this difference is zero. Moreover, since the insulating-layer-forming material and the cover-layer-forming material are the same non-photosensitive material, it is easy to control their physical property values, such as coefficient of hygroscopic expansion. In addition, since there is no need to use an expensive solvent or the like, production costs can be held down.

The substrate for suspension in this form has at least the metallic substrate, the insulating layer, the conductor layer, and the cover layer.

These components of the substrate for suspension in this form will be described hereinafter. The metallic substrate and the conductor layer in this form may be the same as the ones described in the above "1. First Form", so that they will not be explained any more in the following description.

(1) Insulating Layer 2 and Cover Layer 4

The insulating layer for use in this form is formed on the above-described metallic substrate from an insulating-layer-forming material.

The cover layer for use in this form is formed on the insulating layer from a cover-layer-forming material so that it partly covers the above-described conductor layer.

The insulating-layer-forming material and the cover-layer-forming material for use in this form are the same non-photosensitive material, and the coefficients of hygroscopic expansion of the two materials are in the range between 0/% RH and $30 \times 10^{-6}$/% RH.

That the insulating-layer-forming material and the cover-layer-forming material are the same material herein means that the main polymer chain or substituent group in the former is the same in type and amount as the one in the latter, and does not demand that even the additives, which will be described later, incorporated in the materials are also the same in type and amount.

In this form, an insulating-layer-forming material and a cover-layer-forming material that have a coefficient of hygroscopic expansion of 0/% RH to $30 \times 10^{-6}$/% RH are good enough to fulfill the object of the invention. The coefficient of hygroscopic expansion of the materials is preferably from $5 \times 10^{-6}$/% RH to $20 \times 10^{-6}$/% RH, more preferably from $5 \times 10^{-6}$/% RH to $15 \times 10^{-6}$/% RH. This is because when the coefficient of hygroscopic expansion of the materials is in the above range, the substrate for suspension in this form warps only a little even when it has decreased rigidity.

It is preferred that the coefficient of water absorption of the insulating-layer-forming material and that of the cover-layer-forming material be in the range between 0.01% and 2.5%, preferably between 0.7% and 1.5%. This is because a material having a coefficient of water absorption in the above range can form an insulating layer and a cover layer that absorb moisture only a little and thus hygroscopically expand only a little. In this case, there can be obtained a substrate for suspension that warps scarcely even when it has decreased rigidity because of the metallic substrate remaining with a decreased percentage. Furthermore, when the coefficient of water absorption of the material is lower than the above range, only decreased adhesion may be obtained between the cover layer and the insulating layer. On the other hand, when the coefficient of water absorption of the material is higher than the above range, the cover layer and the insulating layer are greatly warped by moisture.

The insulating-layer-forming material and the cover-layer-forming material for use in this form can have any coefficient of thermal expansion, as long as there can be obtained a substrate for suspension that is warped only a little by the difference between the coefficient of thermal expansion of the metallic substrate and that of the insulating-layer-forming material and the cover-layer-forming material. The coefficient of thermal expansion of the insulating-layer-forming material and the cover-layer-forming material is preferably in the range between $15 \times 10^{-6}$/° C. and $30 \times 10^{-6}$/° C., more preferably between $15 \times 10^{-6}$/° C. and $25 \times 10^{-6}$/° C., most preferably between $15 \times 10^{-6}$/° C. and $20 \times 10^{-6}$/° C. This is because when the coefficient of thermal expansion of the two materials is in the above range, there can be obtained a substrate for suspension that is warped scarcely by temperature change even when it has decreased rigidity.

Materials having coefficients of hygroscopic expansion in the above range and also insulating properties can be used for the insulating-layer-forming material and the cover-layer-forming material for use in this form, and such materials include conventional insulating materials.

Such insulating materials may be the same as the non-photosensitive insulating materials described in the above "1. First Form", so that they will not be described any more.

The insulating-layer-forming material and the cover-layer-forming material for use in this form can contain additives such as plasticizers, surface-active agents and anti-foaming agents, as needed.

The details of the insulating layer and the cover layer formed from the insulating-layer-forming material and the cover-layer-forming material, respectively, may be the same as the details of the insulating layer and the cover layer described in the above "1. First Form", so that their descriptions will not be repeated any more.

(2) Substrate for Suspension 10

Any process can be employed to produce the substrate for suspension in this form, as long as the metallic substrate, the insulating layer, the conductor layer, and the cover layer can be laminated with high accuracy and with good adhesion, and a conventional process for producing a substrate for suspension can be used. Specifically, a process that will be described later in the item "B. Process for Producing Substrate for Suspension" can be used.

(3) Uses

The substrate for suspension in this form can be used, for example, for a magnetic head suspension in a hard disk drive (HDD). In particular, it is favorably used for a magnetic head suspension for an HDD, which is required to warp scarcely even when it has decreased rigidity.

B. Process for Producing Substrate for Suspension

A process for producing a substrate for suspension according to the present invention is a process for producing a substrate for suspension comprising a metallic substrate, an insulating layer formed on the metallic substrate, a conductor layer formed on the insulating layer, and a cover layer formed on the insulating layer, covering at least a part of the conductor layer, the process comprising the step of insulating layer formation in which an insulating layer is pattern-wise formed on the metallic substrate from an insulating-layer-forming material, and the step of cover layer formation in which a cover layer is pattern-wise formed on the insulating layer from a cover-layer-forming material, the insulating-layer-forming material and the cover-layer-forming material being different materials, the coefficients of hygroscopic expansion of the two materials being in the range between 0/% RH and $30 \times 10^{-6}$/% RH, and the difference between the coefficients of hygroscopic expansion of the two materials being $5 \times 10^{-6}$/% RH or less.

Figure 2:
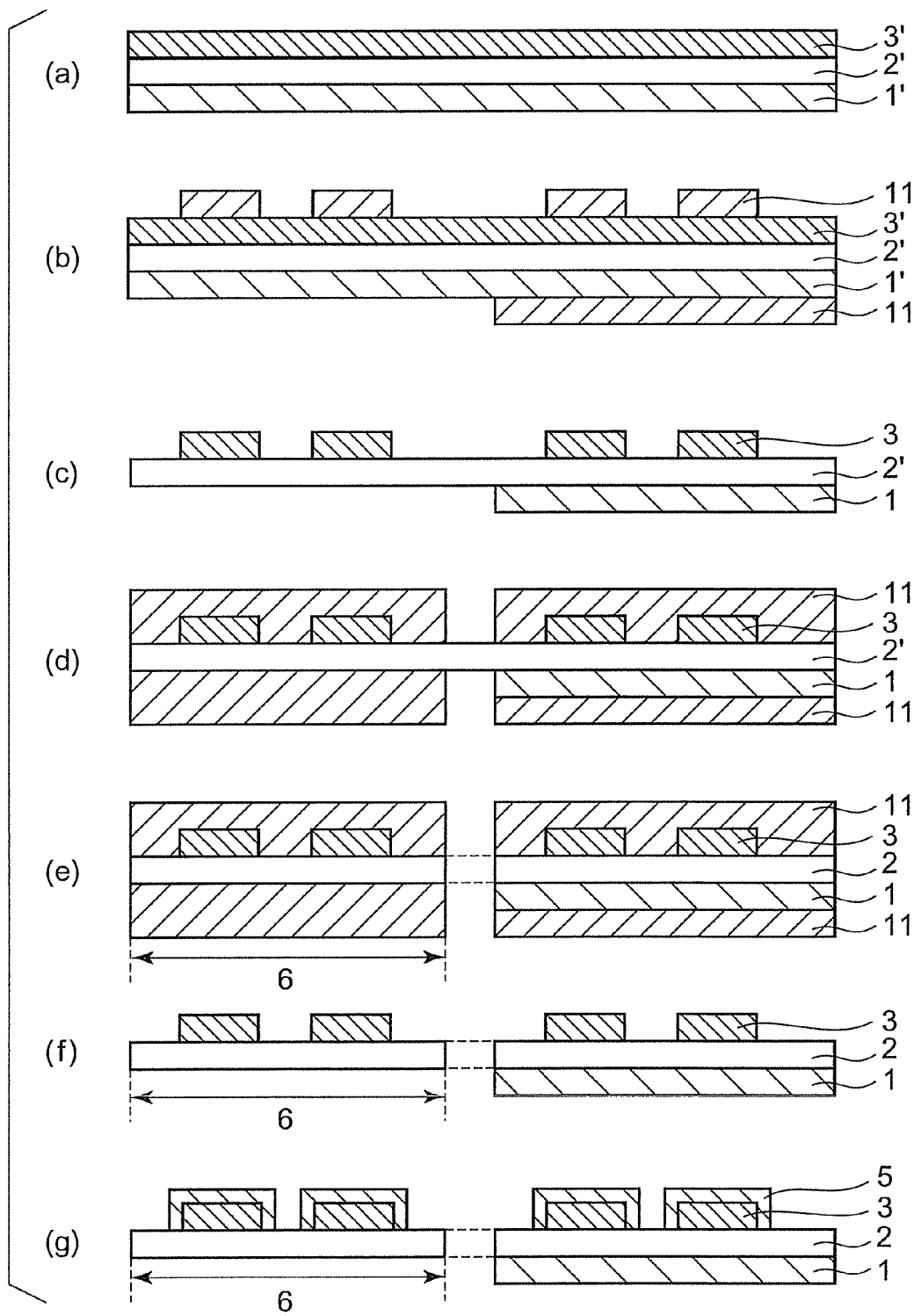
FIG. 2 is a flow chart illustrating a process for producing a substrate for suspension according to the present invention.

Such a process for producing a substrate for suspension according to the present invention will be described with reference to the accompanying drawings. FIG. 2 is a flow chart showing an example of the process for producing a substrate for suspension of the present invention. The process for producing a substrate for suspension of the invention is as follows. After preparing a laminate of a metallic substrate layer 1', an insulating-layer-forming layer 2' formed from the insulating-layer-forming material, and a conductor-layer-forming layer 3', as shown in FIG. 2(a), photoresist layers 11 in the form of dry films or the like are placed on both sides of the laminate and are then patterned into the desired shapes (FIG. 2(b)). Subsequently, the metallic substrate layer 1' and the conductor-layer-forming layer 3' are patterned by etching, and the photoresist layers 11 are stripped, thereby obtaining a patterned metallic substrate 1 and a patterned conductor layer 3 (FIG. 2(c)). Photoresist layers 11 in the form of dry films or the like are placed and are patterned into the desired shape (FIG. 2(d)). After patterning the insulating-layer-forming layer 2' by etching (FIG. 2(e)), the photoresist layers 11 are stripped, thereby obtaining a patterned insulating layer (FIG. 2(f)).

Using the conductor layer 3 as a feeder layer, electroplating is conducted to form a protective deposit 5 on the surface of the conductor layer 3 (FIG. 2(g)).

Successively, a cover-layer-forming layer 4' is formed on the insulating layer 2 from the cover-layer-forming material, as shown in FIG. 3(a), and a photoresist layer 11 in the form of a dry film or the like is placed on the cover-layer-forming layer 4' (FIG. 3(b)) and is patterned into the desired shape (FIG. 3(c)). Subsequently, the cover-layer-forming layer 4' is subjected to patterning conducted by etching to form a cover layer 4 (FIG. 3(d)), and the photoresist layer 11 is stripped.

In this manner, a substrate for suspension 10 is obtained (FIG. 3(e)). The insulating layer 2 contained in the substrate for suspension 10 produced includes a low-rigidity area 6 that is a portion of one side of the insulating layer 2 from which the metallic substrate 1 has been removed so that it is not covered with the metallic substrate 1 in order to make the substrate for suspension less rigid.

The insulating-layer-forming material and the cover-layer-forming material are different materials whose coefficients of hygroscopic expansion are in the range between 0/% RH and $30 \times 10^{-6}$/% RH, the difference between the coefficients of hygroscopic expansion of the two materials being $5 \times 10^{-6}$/% RH or less.

FIGS. 2(a)-2(c) show the step of metallic substrate and conductor layer formation, and FIGS. 2(d)-2(f), the step of insulating layer formation. FIG. 2(g) shows the step of protective deposit formation, and FIGS. 3(a)-3(e), the step of cover layer formation.

According to the present invention, since the insulating-layer-forming material and the cover-layer-forming material that have coefficients of hygroscopic expansion in the above range, the difference between the coefficients of hygroscopic expansion of the two materials being in the above range, are used to form the insulating layer and the cover layer, respectively, there can be obtained, by the production process of the invention, a substrate for suspension that is warped only a little by moisture even when it has decreased rigidity.

The process for producing the substrate for suspension according to the present invention comprises at least the step of insulating layer formation and the step of cover layer formation. These steps in the process for producing the substrate for suspension of the invention will be hereinafter described in detail.

1. Step of Insulating Layer Formation

The step of insulating layer formation in the present invention is the step of forming pattern-wise an insulating layer on the metallic substrate from an insulating-layer-forming material.

The insulating-layer-forming material to be used in this step is different from the cover-layer-forming material to be used in the step of cover layer formation that will be described later, and its coefficient of hygroscopic expansion is from 0/% RH to $30 \times 10^{-6}$/% RH. The difference between the coefficient of hygroscopic expansion of the insulating-layer-forming material and that of the cover-layer-forming material that will be described later is $5 \times 10^{-6}$/% RH or less. A material having the same physical properties and components as those of the material described in the above "A. Substrate for Suspension" can be used as the insulating-layer-forming material, so that it will not be explained in the following description any more.

Any method can be used in this form to form pattern-wise an insulating layer as long as an insulating layer in the desired pattern can be formed from the insulating-layer-forming layer. For example, the following method can be used. After forming, on the entire surface of the metallic substrate, an insulating-layer-forming layer from the insulating-layer forming material, a photoresist layer 11 is formed pattern-wise on those portions of the insulating-layer-forming layer 2' that should not be removed by etching. The insulating-layer-forming layer 2' is etched with a predetermined etchant to form an insulating layer (FIG. 2(e)), and the photoresist layer 11 is stripped as shown in FIG. 2(f).

Any method can be used to form an insulating-layer-forming layer from the insulating-layer-forming material, as long as an insulating-layer-forming layer can be formed uniformly in thickness. Examples of methods useful herein include a method in which the insulating-layer-forming material is applied directly to the metallic substrate, and a method in which the insulating-layer-forming material is dispersed or dissolved in a solvent to form a liquid insulating-layer-forming material and this liquid is applied to the metallic substrate and is dried.

Any technique can be employed to apply the insulating-layer-forming material to the metallic substrate as long as an insulating-layer-forming layer can be formed uniformly in thickness, and a variety of known techniques, such as die coating, can be used.

To form the patterned photoresist layer, the following method can be used, for example. A photoresist layer formed by applying a liquid photosensitive resin to the insulating layer and drying the resin, or a dry film resist, which is a photosensitive resin in the form of a dry film, stuck to the entire surface of the insulating layer, is exposed to light through a photomask or the like and is developed.

For the above-described photosensitive resin and method of exposure and development, those ones that are usually used in the production of a substrate for suspension can be used.

The details of the metallic substrate and those of the insulating layer formed on the metallic substrate may be the same as the details of the metallic substrate and the insulating layer that are described in the above "A. Substrate for Suspension", so that they will not be described below.

2. Step of Cover Layer Formation

The step of cover layer formation in the present invention is the step of forming pattern-wise a cover layer on the insulating layer that has been formed in the above-described step of insulating layer formation, from a cover-layer-forming material so that it covers at least a part of the conductor layer.

The cover-layer-forming material to be used in this step is different from the insulating-layer-forming material that is used in the step of insulating layer formation, and its coefficient of hygroscopic expansion is in the range between $3 \times 10^{-6}$/% RH and $30 \times 10^{-6}$/% RH. The difference between the coefficient of hygroscopic expansion of the insulating-layer-forming material and that of the cover-layer-forming material is $5 \times 10^{-6}$/% RH or less. Such a cover-layer-forming material can have the same physical properties and components as those of the cover-layer-forming material described in the above "A. Substrate for Suspension", so that it will not be described below any more.

Figure 3:
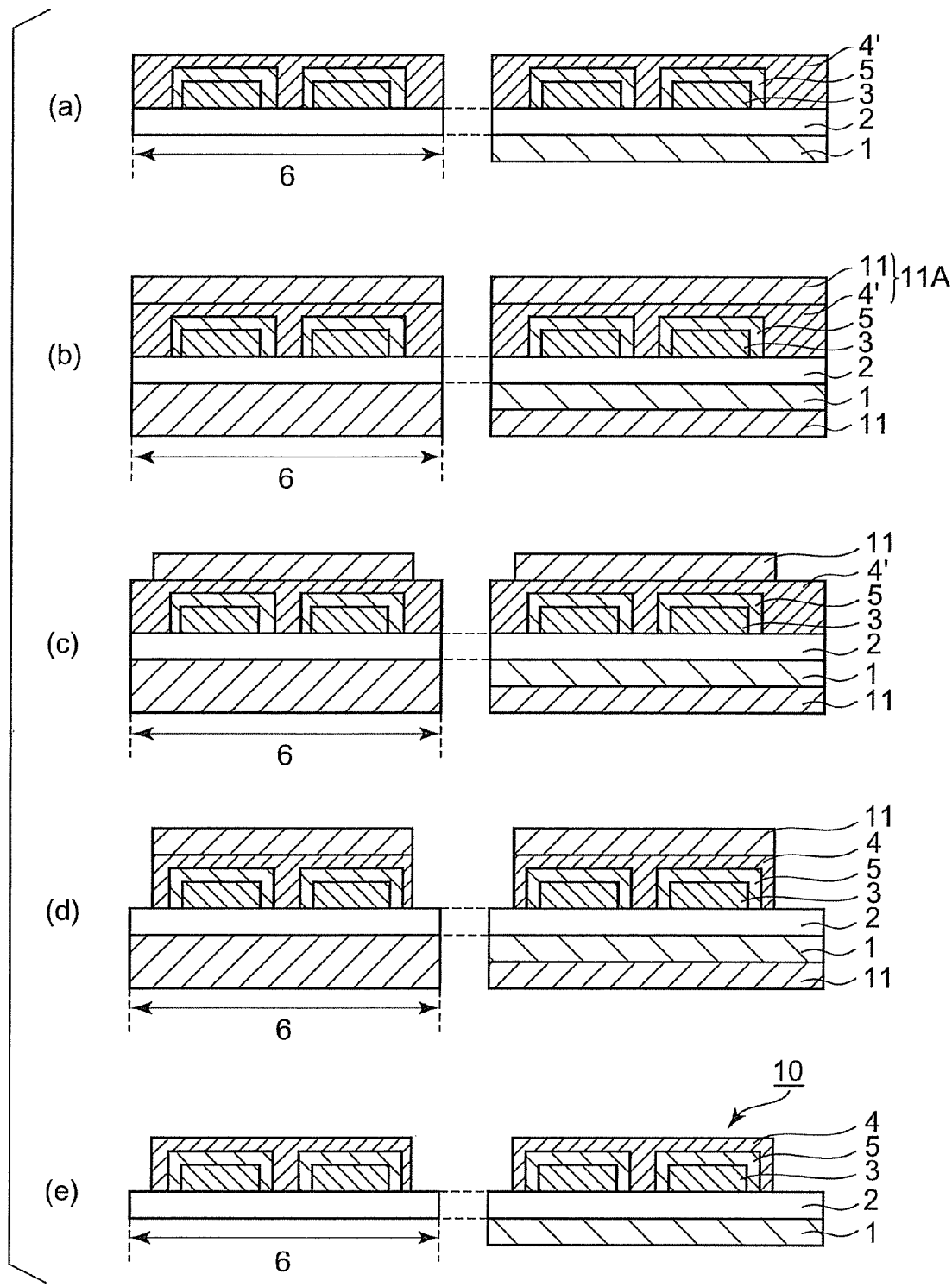
FIG. 3 is a flow chart illustrating a process for producing a substrate for suspension according to the present invention.

Any method can be used in this form to form pattern-wise a cover layer as long as a cover layer in the desired pattern can be formed from the cover-layer-forming material. For example, the following method as shown in FIG. 3 can be used. A cover-layer-forming-layer 4' is formed from the cover-layer-forming material on the entire surface of the insulating layer 2 that has been formed in the above-described step of insulating layer formation (FIG. 3(a)). Subsequently, a patterned photoresist layer 11 is formed so that the resist covers those portions of the cover-layer-forming layer 4' that should not be removed by etching (FIGS. 3(b) and 3(c)), and the cover-layer-forming layer 4' is etched with a predetermined etchant to form a cover layer 4 (FIG. 3(d)). After this, the photoresist layer 11 is stripped. Those portions of the cover-layer-forming layer 4' that should not be removed by etching are determined so that they cover at least a part of the conductor layer.

In this step, particularly when the cover-layer-forming material is non-photosensitive, it is preferable to form pattern-wise the cover layer 4 in the following manner. A laminate 11A of a non-photosensitive cover-layer-forming layer 4' formed from a non-photosensitive cover-layer-forming material and a photoresist layer formed on the non-photosensitive cover-layer-forming layer 4' from a photosensitive resin is placed on the entire surface of the insulating layer 2. After exposing pattern-wise the photoresist layer 11 in the laminate 11A to light, the pattern-wise-exposed photoresist layer 11 and the non-photosensitive cover-layer-forming layer 4' are simultaneously developed.

In the step of cover layer formation, the photoresist layer is pattern-wise exposed to light, and the pattern-wise-exposed photoresist layer 11 and the non-photosensitive cover-layer-forming layer 4' are simultaneously developed, thereby forming pattern-wise a cover layer 4. Therefore, the number of operations needed to form the cover layer 4 is smaller.

To form the cover-layer-forming layer from the cover-layer-forming material, any method can be employed as long as it can provide a cover-layer-forming layer uniform in thickness. For instance, the following method can be used. A cover-layer-forming material in film form, serving as the cover-layer-forming layer, is stuck to the entire surface of the insulating layer; or the cover-layer-forming material is dispersed or dissolved in a solvent to form a liquid cover-layer-forming material, and this liquid is applied to the insulating layer and is dried.

In this step, it is preferred that the cover layer be formed from a cover-layer-forming layer that is formed by applying a liquid cover-layer-forming material containing the cover-layer-forming material. The use of a liquid cover-layer-forming material containing the cover-layer-forming material makes it easy to form a thinner cover layer.

In the case where the cover-layer-forming material is photosensitive, the liquid cover-layer-forming material may contain the above-described photosensitive insulating material or monomer and a photopolymerization initiator.

To form the patterned photoresist layer, the method described in the above "1. Step of Insulating Layer Formation" can be used.

Further, the details of the conductor layer and the cover layer may be the same as those of the conductor layer and the cover layer that are described in the above "A. Substrate for Suspension".

3. Process for Producing Substrate for Suspension

Any process can be employed to produce a substrate for suspension of the invention as long as it comprises at least the above-described step of insulating layer formation and step of cover layer formation. The production process of the present invention usually comprises the step of metallic substrate formation in which a metallic substrate is made into the desired pattern, and the step of conductor layer formation in which a conductor layer in the desired pattern is formed. The production process of the invention may further comprise the step of protective deposit formation in which a protective deposit is formed on the surface of the conductor layer.

Any method can be used to form the metallic substrate and the conductor layer in the step of metallic substrate formation and the step of conductor layer formation, respectively, as long as the metallic substrate and the conductor layer can be formed in the desired positions with high accuracy. Specifically, the following method can be employed, for example. After forming a patterned photoresist layer so that the resist covers those portions that should not be removed by etching, as in the above-described step of insulating layer formation and step of cover layer formation, etching is conducted using a predetermined etchant.

In the above-described step of protective deposit formation, electroplating using the conductor layer as a feeder can be employed to form the protective deposit.

In the present invention, the step of insulating layer formation and that of cover layer formation can be performed in any order, and the order may be determined with consideration for the use of the substrate for suspension to be produced by the production process of the invention, etc.

The substrate for suspension produced by the production process of the present invention is used, for example, for a magnetic head suspension in a hard disk drive (HDD). In particular, it is favorably used for a magnetic head suspension for use in an HDD, which is required to warp only a little even when it has decreased rigidity.

The present invention is not limited to the aforementioned embodiment. The above-described embodiment is to be considered in all respects as illustrative and not restrictive, and all changes which come within the meaning and range of equivalency of the appended claims are therefore intended to be embraced in the scope of the invention.

EXAMPLES

The present invention will now be explained more specifically by way of examples.

Production Example 1

4.0 g (20 mmol) of 4,4'-diaminodiphenyl ether (ODA) and 8.65 g (80 mmol) of paraphenylene diamine (PPD) were placed in a 500 ml separable flask and were dissolved in 200 g of dehydrated N-methyl-2-pyrrolidone (NMP). In a stream of nitrogen, the solution was stirred while heating it to 50° C. in an oil bath, with the temperature of the solution monitored with a thermocouple. After the compounds had been completely dissolved, 29.1 g (99 mmol) of 3,3',4,4'-biphenyltetracarboxylic dianhydride (BPDA) was added little by little to the solution over 30 minutes. After the addition of BPDA had been completed, the mixture was stirred at 50° C. for five hours and was then cooled to room temperature. In this manner, polyimide's precursor solution 1 was obtained.

Production Examples 2 to 12

Polyimide's precursor solutions 2-12 and a comparative polyimide's precursor solution, having the formulations shown in Table 1, were obtained in the same manner as in Production Example 1, except that the amount of NMP was changed so that the solutions contained 17 to 19% by weight of the compounds, and that the reaction temperature was varied as desired.

Pyromellitic dianhydride: PMDA
1,4-Bis(4-aminophenoxyl)benzene: 4APB
2,2'-Dimethyl-4,4'-diaminobiphenyl: TBHG
2,2'-Bis(trifluoromethyl)-4,4'-diaminobiphenyl: TFMB

TABLE 1

| | Acid amhydride/ amount used (mmol) | Diamine/ amount used (mmol) | Diamine/ amount used (mmol) | Reaction temperature (° C.) |
|---|---|---|---|---|
| polyimide's precursor solution 1 | BPDA 99 | PPD 80 | ODA 20 | 50 |
| polyimide's precursor solution 2 | BPDA 99 | PPD 100 | | 50 |
| polyimide's precursor solution 3 | BPDA 99 | PPD 80 | 4APB 20 | 50 |
| polyimide's precursor solution 4 | BPDA 99 | | TBHG 100 | 50 |
| polyimide's precursor solution 5 | BPDA 99 | ODA 80 | TBHG 20 | 50 |
| polyimide's precursor solution 6 | BPDA 99 | ODA 75 | TBHG 25 | 50 |
| polyimide's precursor solution 7 | BPDA 99 | | TFMB 100 | 50 |
| polyimide's precursor solution 8 | BPDA 99 | PPD 80 | TFMB 20 | 50 |
| polyimide's precursor solution 9 | BPDA 99 | PPD 70 | TFMB 30 | 50 |
| polyimide's precursor solution 10 | BMDA 99 | | TBHG 100 | 0 |
| polyimide's precursor solution 11 | BMDA 99 | | ODA 100 | 0 |
| polyimide's precursor solution 12 | BMDA 99 | PPD 50 | ODA 50 | 0 |
| Comparative polyimide's precursor solution 1 | BPDA 99 | ODA 100 | | 50 |

Further, in order to obtain a photosensitive polyimide, niphedipine (manufactured by Tokyo Kasei Kogyo Co., Ltd., Japan) was added to the polyimide's precursor solution 1 in an amount of 30% by weight of the solid matter of the solution, thereby obtaining a photosensitive-polyimide's precursor solution.

[Evaluation of Coefficient of Linear Thermal Expansion and Coefficient of Hygroscopic Expansion]

The polyimide's precursor solutions 1 to 12 and the comparative polyimide's precursor solution 1 were applied to films Eupirex S 50S (trade name, manufactured by Ube Industries, Ltd., Japan) stuck to glass plates. They were dried on a hot plate at 80° C. for 10 minutes and were then separated from the Eupirex, thereby obtaining films with thicknesses ranging from 15 to 20 μm. These films were fixed in metal frames and were thermally treated at 350° C. in nitrogen atmosphere for one hour (rate of heat-up: 10° C./min., cooled in the air). In this manner, there were obtained polyimide films 1-12 and comparative polyimide film 1, each film having a thickness of 9 μm to 15 μm.

The photosensitive-polyimide's precursor solution 1 was applied to a film Eupirex S 50S (trade name, manufactured by Ube Industries, Ltd., Japan) stuck to a glass plate, and was dried on a hot plate at 80° C. for 10 minutes. The dried film was exposed to light from a high-pressure mercury vapor lamp, having a wavelength of 365 nm and an illumination intensity of 500 mJ/cm². The exposed film was heated on a hot plate at 180° C. for three minutes and was then separated from the Eupirex, thereby obtaining a film with a thickness of 17 µm. This film was fixed in a metal frame and was thermally treated at 350° C. in nitrogen atmosphere for one hour (rate of heat-up: 10° C./min., cooled in the air). In this manner, there was obtained photosensitive polyimide film 1 with a thickness of 12 µm.

<Coefficient of Linear Thermal Expansion>

Each film obtained in the above-described manner was cut to a width of 5 mm and a length of 20 mm and was used in evaluation as a sample. Apparatus for thermomechanical analysis Thermo Plus TMA8310 (manufactured by RIGAKU Corp., Japan) was used to determine the coefficients of linear thermal expansion of the samples. Measurements were carried out under the following conditions:

length of observation: 15 mm
rate of heat-up: 10° C./min
tensile load: 1 g/25000 µm² (loads per sectional area of the samples being the same)

The average coefficient of linear thermal expansion of the sample at temperatures between 100° C. and 200° C. was taken as the coefficient of linear thermal expansion (C.T.E.) of the sample.

<Coefficient of Hygroscopic Expansion>

Each film obtained in the above-described manner was cut to a width of 5 mm and a length of 20 mm and was used in evaluation as a sample. A humidity-variable mechanical analyzer Thermo Plus TMA8310-modified (manufactured by RIGAKU Corp., Japan) was used to determine the coefficients of hygroscopic expansion of the samples. The samples were placed in an atmosphere whose temperature was kept constant at 25° C. The relative humidity of the atmosphere was first adjusted to 15%, and the samples were stabilized in this atmosphere and were held as they were for about 30 minutes to 2 hours. After this, the measuring portions of the samples were humidified to 20% RH, and the samples were left as they were for about 30 minutes to two hours until they were stabilized. The relative humidity of the atmosphere was varied to 50%, and the samples were stabilized in this atmosphere. The difference between the length of each sample at 20% RH and that of the sample at 50% RH was divided by the difference in humidity (in this case, the difference is 30 (=50−20)), and the value obtained was divided by the length of the sample. The value obtained in this manner was taken as the coefficient of hygroscopic expansion (C.H.E.) of the sample. The tensile load was made 1 g/25000 µm² so that the loads per sectional area of the samples were the same.

[Evaluation of Warping of Substrate]

Under the same process conditions as those used for the measurement of coefficient of linear thermal expansion, polyimide films and a photosensitive polyimide film were formed on 20-µm thick SUS plates (metallic substrates) by the use of the above-described polyimide's precursor solutions and photosensitive-polyimide's precursor solution so that the polyimides produced from the precursors would form films with thicknesses of 10 µm±1 µm. Each substrate covered with the polyimide film was cut to a width of 10 mm and a length of 50 mm, and the polyimide film was partially removed as shown in a plane view in FIG. 1(b) so that two 2-mm wide, stripe-shaped portions of the SUS plate were exposed, the two portions being situated 2 mm apart, with each portion 2 mm apart from each longer side of the polyimide film. In this manner, samples to be subjected to observation of warping of substrate were obtained.

Each sample was fixed to a SUS plate with Kapton tape only at one shorter end and was heated in an oven at 100° C. for one hour. The vertical distance between the SUS plate and the other shorter end of the sample that had risen from the SUS plate was measured in the oven at 100° C. When this distance was 0 to 0.5 mm, the sample was evaluated as ◯; when the distance was 0.5 to 1.0 mm, Δ; and when the distance was greater than 1.0 mm, x.

Similarly, this sample was fixed to a SUS plate with Kapton tape only at one shorter end and was placed in a thermo-hygrostat at 85° C. and 85% RH for one hour. The vertical distance between the SUS plate and the other shorter end of the sample that had risen from the SUS plate was measured. When this distance was 0 to 0.5 mm, the sample was evaluated as ◯; when the distance was 0.5 to 1.0 mm, Δ; and when the distance was greater than 1.0 mm, x.

The results of these evaluations are shown in Table 2.

TABLE 2

| | CTE (ppm/° C.) | CHE (ppm/Rh %) | Warping of substrate caused by heating | Warping of substrate caused at 85% RH and 85° C. |
|---|---|---|---|---|
| Polyimide 1 | 18.9 | 8.4 | ◯ | ◯ |
| Polyimide 2 | 10.9 | 8.5 | ◯ | ◯ |
| Polyimide 3 | 19.3 | 10.9 | ◯ | ◯ |
| Polyimide 4 | 4.6 | 5.1 | Δ | ◯ |
| Polyimide 5 | 12.3 | 6.1 | ◯ | ◯ |
| Polyimide 6 | 22.0 | 8.7 | ◯ | ◯ |
| Polyimide 7 | 31.1 | 3.5 | X | ◯ |
| Polyimide 8 | 11.4 | 5.9 | ◯ | ◯ |
| Polyimide 9 | 15.4 | 3.4 | ◯ | ◯ |
| Polyimide 10 | 14.2 | 3.8 | ◯ | ◯ |
| Polyimide 11 | 35.2 | 20.4 | X | Δ |
| Polyimide 12 | 17.2 | 21.6 | ◯ | X |
| Photosensitive polyimide 1 | 26.1 | 16.0 | Δ | Δ |
| Comparative polyimide1 | 43.9 | 21.8 | X | X |

The above results demonstrate that when the coefficient of hygroscopic expansion of the polyimide is lower, the substrate less warps in a high-humidity atmosphere.

[Evaluation of Development Characteristics]

The above-described polyimide's precursor solutions, comparative polyimide's precursor solution, and photosensitive-polyimide's precursor solution were applied to 20-µm thick SUS 304 plates (metallic substrates) and were dried on a hot plate at 80° C. for ten minutes, thereby obtaining films of the polyimide's precursors 1-12, a film of the comparative polyimide's precursor 1, and a film of the photosensitive-polyimide's precursor 1, each film having a thickness of 15 µm±1 µm.

After this, the film of the photosensitive-polyimide's precursor 1 was heated on a hot plate at 180° C. for three minutes.

The solubility of each film in the following four solutions at 23° C. was observed:

A) a 1 wt. % aqueous solution of tetramethyl ammonium hydroxide (TMAH),
B) a 5 wt. % aqueous solution of TMAH,
C) A 9:1 mixture of a 3 wt. % aqueous TMAH solution and ethanol, and
D) A 1:1 mixture of a 5 wt. % aqueous TMAH solution and ethanol.

◯ was given to the film that was completely dissolved in the solution, and x, to the film that swelled or partly remained undissolved. The results are shown in FIG. 3.

The results show that polyamic acid containing fluorine is poor in solubility in an aqueous solution and requires a solution containing a large amount of an alcohol for development.

TABLE 3

|  | A | B | C | D |
|---|---|---|---|---|
| Polyimide 1 | ○ | ○ | ○ | ○ |
| Polyimide 2 | ○ | ○ | ○ | ○ |
| Polyimide 3 | ○ | ○ | ○ | ○ |
| Polyimide 4 | ○ | ○ | ○ | ○ |
| Polyimide 5 | ○ | ○ | ○ | ○ |
| Polyimide 6 | ○ | ○ | ○ | ○ |
| Polyimide 7 | X | X | X | ○ |
| Polyimide 8 | X | X | X | ○ |
| Polyimide 9 | X | X | X | ○ |
| Polyimide 10 | ○ | ○ | ○ | ○ |
| Polyimide 11 | ○ | ○ | ○ | ○ |
| Polyimide 12 | ○ | ○ | ○ | ○ |
| Photosensitive Polyimide 1 | ○ | ○ | ○ | ○ |
| Comparative Polyimide 1 | ○ | ○ | ○ | ○ |

Example 2

A first non-photosensitive polyimide serving as the insulating-layer-forming material was applied, by coating, to a 20-μm thick SUS 304 plate (metallic substrate) to form an insulating layer with a thickness of 10 μm. Ni—Cr—Cu was sputtered to the insulating layer to form a seed layer with a thickness of about 300 nm. By using the Ni—Cr—Cu deposit as a continuity layer, Cu deposit (metal deposit) with a thickness of 9 μm was formed by plating, thereby obtaining a laminate of four layers (see FIG. 1(a)). From this four-layered laminate, a low-rigidity substrate for suspension having fine conductors was produced.

The physical property values of the insulating-layer-forming material (first non-photosensitive polyimide) were as follows:

coefficient of hygroscopic expansion: $10.7\times10^{-6}$/% RH, and coefficient of thermal expansion: $21\times10^{-6}$/% RH.

Resist layers in the form of dry films were placed on both sides of the laminate and were patterned at one time so that the patterned resist layers were useful for making a jig hole on the substrate side, in which high positional accuracy is essential, and for forming the intended conductor layer on the Cu deposit side. After the laminate had been etched with a ferric chloride solution, the resist layers were stripped. Since the two dry resist films are patterned at one time in this step, the jig hole can be made on the SUS side and the conductor layer can be formed on the other side with higher positional accuracy. The width of the lines in the patterned conductor layer was 20 μm, and the distance between two adjacent lines was 20 μm. The absence of anchor-shaped portions in the conductor layer and the use of high-sensitive DFRs are considered to contribute greatly to the realization of minute conductors.

Next, a non-photosensitive polyimide serving as the liquid cover-layer-forming material was applied with a die coater and was dried. A patterned resist layer was formed on this cover-layer-forming material layer, and the latter was etched simultaneously with the development of the former, and was then hardened, thereby obtaining a cover layer formed from the cover-layer-forming material (second non-photosensitive polyimide). The thickness of the hardened cover layer on the conductor layer was 5 μm. Such a cover layer can contribute to suppression of warping, reduction in rigidity, and protection of the patterned conductor layer.

The physical property values of the cover-layer-forming material (second non-photosensitive polyimide) used to form the cover layer were as follows:

coefficient of hygroscopic expansion: $8.0\times10^{-6}$/% RH, and coefficient of thermal expansion: $17\times10^{-6}$/% RH.

The physical property values of the insulating-layer-forming material (first non-photosensitive polyimide) were as follows:

coefficient of hygroscopic expansion: $10.7\times10^{-6}$/% RH, and coefficient of thermal expansion: $21\times10^{-6}$/% RH.

As is clear from the above, the difference between the physical property values of the insulating-layer-forming material and those of the cover-layer-forming material was small.

Next, after forming a patterned resist layer on the polyimide layer (insulating layer) with a thickness of 10 μm, the polyimide layer was etched with an organic alkali etchant, thereby obtaining a patterned insulating layer. Subsequently, Au was deposited by plating on the exposed portions of the conductor pattern layer to form a protective deposit with a thickness of 2 μm. In the present invention, the conductor layer is covered with the cover layer before forming the protective deposit, and Au is deposited only on those portions of the conductor layer that are not covered with the cover layer. This is very effective in decreasing rigidity and also in reducing the amount of Au to be used.

Next, in order to process the external side of the SUS plate, a patterned resist layer was formed on the SUS plate, and only the SUS plate was etched. Lastly, a solder bump was formed by screen process printing using a lead-free soldering paste. The substrate for suspension obtained in this manner was warped at normal temperatures only by 0.5 mm. Even after the substrate for suspension had been left in a high-temperature, high-humidity atmosphere (85° C., 85% RH) for 1 hour, its warpage was 0.5 mm. Thus, the substrate for suspension was successfully prevented from being warped.

The warping of the substrate for suspension was evaluated in the following manner. A sample with a length of 20 mm was cut out of the substrate for suspension and was placed on a surface plate, with the copper conductor layer side facing up, and the vertical distance between the surface of the surface plate and the rising end of the sample was measured with a high-precision ruler.

Comparative Example

A substrate for suspension was made in the same manner as in the above Example, except that a third non-photosensitive polyimide having a coefficient of thermal expansion of $23\times10^{-6}$/% RH and a coefficient of hygroscopic expansion of $31\times10^{-6}$/% RH was used as the insulating-layer-forming material, and that a photosensitive polyimide having a coefficient of thermal expansion of $200\times10^{-6}$/% RH and a coefficient of hygroscopic expansion of $155\times10^{-6}$/% RH was used as the cover-layer-forming material.

The substrate for suspension obtained in this manner was warped at normal temperatures by 2.0 mm. After the substrate for suspension had been left in a high-temperature, high-humidity atmosphere (85° C., 85% RH) for 1 hour, its warpage was 2.0 mm. Thus, the substrate for suspension was not prevented from being warped.

Second Embodiment

A process for producing a substrate for suspension according to the second embodiment of the present invention will be described hereinafter in detail.

A process for producing a substrate for suspension according to the present invention comprises the step of laminate preparation in which a laminate of a metallic substrate, an insulating layer, a seed layer, and a metal deposit that are situated in the order named is prepared, and the step of first metal etching in which, by etching the laminate after covering the surface of the metallic substrate and that of the metal deposit with patterned resist layers, a jig hole is made in the metallic substrate and a conductor pattern layer is formed on the metal deposit.

According to the present invention, since the above-described laminate is used, there can be obtained a low-rigidity substrate for suspension. In the step of first metal etching, although a jig hole, a cavity, and the like are made in the metallic substrate, the most part of the metallic substrate is not removed by etching. Therefore, etching of the insulating layer, etc. can be conducted with the rigidity of the laminate held high, and the laminate under processing can be prevented from being deformed while it is carried from one step to another. The substrate for suspension obtained by the production process of the invention can be used, for example, as a substrate for a magnetic head suspension to be used in a hard disk drive (HDD).

Figure 4:
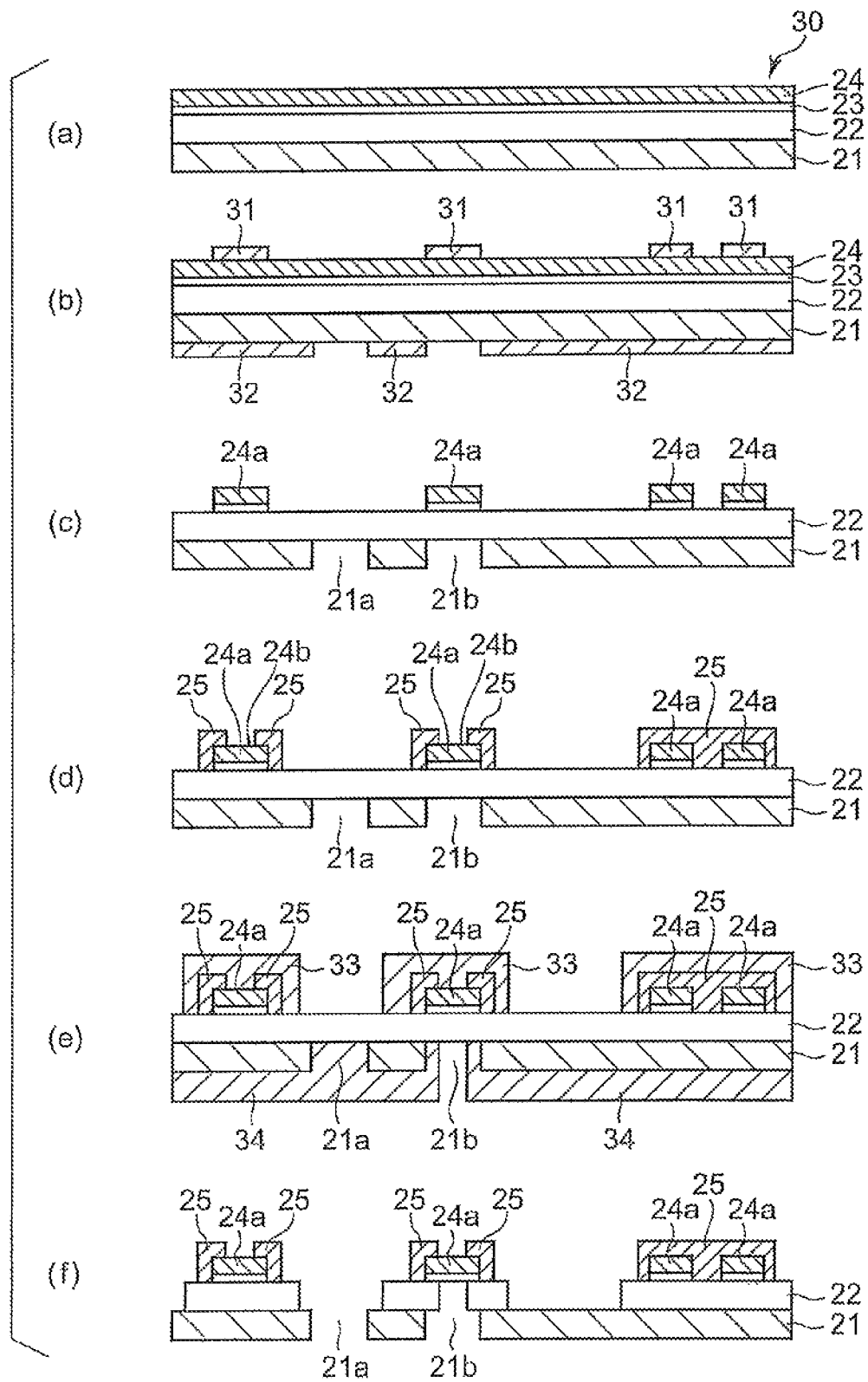
FIG. 4 is a view illustrating a process for producing a substrate for suspension according to the second embodiment of the present invention.
Figure 5:
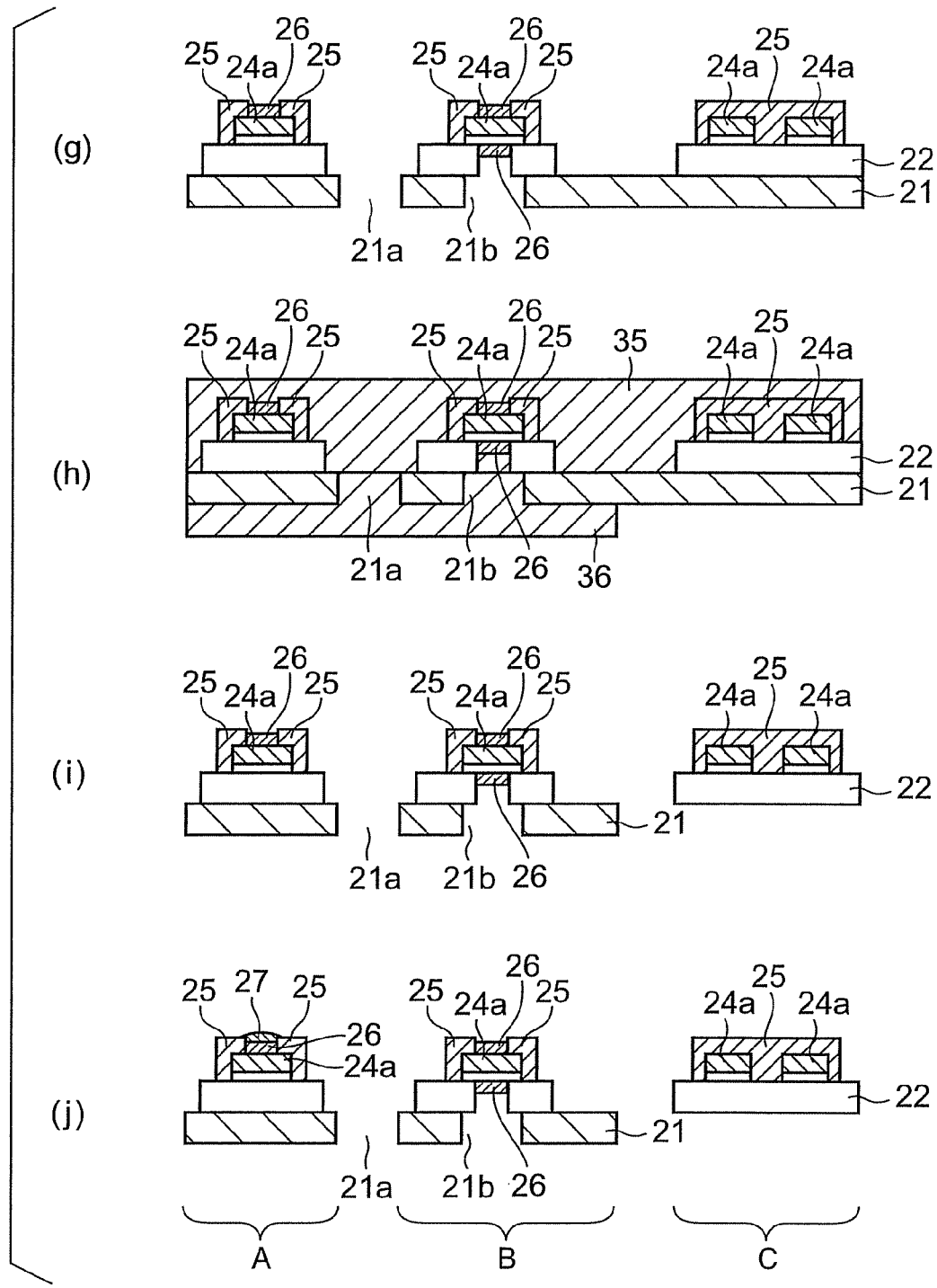
FIG. 5 is a view illustrating a process for producing a substrate for suspension according to the second embodiment of the present invention.

The process for producing a substrate for suspension according to the present invention will be described with reference to the accompanying drawings. FIGS. 4 and 5 are views illustrating an example of the process for producing a substrate for suspension of the invention. In the present invention, a laminate 30 of a metallic substrate 21, an insulating layer 22, a seed layer 23, and a metal deposit 24 that are situated in the order named is first prepared as shown in FIG. 4(a) (the step of laminate preparation). Herein prepared is a laminate 30 of a SUS plate serving as the metallic substrate 1, a polyimide layer serving as the insulating layer 22, a Ni—Cr—Cu sputtered layer serving as the seed layer 23, and Cu deposit serving as the metal deposit 24.

Next, on this laminate 30, patterned resist layers for metal etching are formed. Specifically, resist layers for metal etching are formed on both sides of the laminate 30 and are photolithographically patterned to form patterned resist layers 31, 32 as shown in FIG. 4(b). In this step, the resist layer formed on the conductor side is patterned so that the pattern of the resist layer 31 corresponds to the conductor pattern layer, and the resist layer formed on the metallic substrate side is patterned by removing the resist in the position corresponding to the position of a jig hole. Of the resist layer formed on the metallic substrate side, a portion corresponding to the flying lead area is removed as well.

The metal substrate 21 and the metal deposit 24 are etched with a chemical etchant and the resist layers 31, 32 are stripped, as shown in FIG. 4(c), whereby a conductor pattern layer 24a is formed from the metal deposit 24, and the jig hole 21a is made in the metallic substrate 21 (the step of first metal etching). In the figure, reference numeral 21b denotes a cavity for forming the flying lead area.

Next, a cover layer 25 is formed on the conductor pattern layer 24a by the use of a liquid covering material, as shown in FIG. 4(d) (the step of cover layer formation). In this step, the cover layer 25 is formed so that a portion 24b of the surface of the conductor pattern layer 24a is exposed. On this exposed portion 24b, a protective deposit, which will be described later, will be formed.

Next, resist layers for etching the insulating layer 22 are formed. Specifically, resist layers for polyimide etching are formed on both sides of the laminate 30 and are photolithographically patterned to form patterned resist layers 33, 34 as shown in FIG. 4(e). In this step, on the conductor side, the patterned resist layer 33 is formed so that it covers the conductor pattern layer 24a and the cover layer 25, and, on the substrate side, the patterned resist layer 34 is formed by removing, from the resist layer, a portion corresponding to the cavity 21b for the flying lead area.

The insulating layer 22 is etched with an organic alkali solution, etchant, and the resist layers 33, 34 are stripped, as shown in FIG. 4(f), whereby the conductor pattern layer 24a and the cover layer 25 are integrally formed on the metallic substrate 21, with the insulating layer 22 between the former two and the latter (the step of insulating layer etching). The metallic substrate 21 has the jig hole 21a and the cavity 21b for the flying lead area. Plasma etching may also be used to process the insulating layer 22.

Next, as shown in FIG. 5(g), Au or Ni—Au is deposited on the exposed portions of the conductor pattern layer 24a to form protective deposits 26 (the step of protective deposit formation).

Resist layers for metal etching are formed on both sides of the laminate 30, in order to process the external side of the metallic substrate 21. In the present invention, "to process the external side of the metallic substrate" means that those portions of the metallic substrate that have not been processed in the step of first metal etching are processed according to the intended shape of the substrate for suspension. Specifically, resist layers for metal etching are formed on both sides of the laminate 30 and are photolithographically patterned, thereby forming patterned resist layers 35, 36 as shown in FIG. 5(h). In this step, on the conductor side, the resist layer 35 is formed so that it covers the entire surface, and on the substrate side, the resist layer 36 is formed in a pattern corresponding to the intended external shape.

The metallic substrate 21 is etched with a chemical etchant, and the resist layers 35, 36 are stripped, as shown in FIG. 5(i), whereby a substrate for suspension in the desired shape is obtained (the step of second metal etching). After this, a solder bump 27 is formed, when necessary, on the terminal area of the conductor pattern layer 24a by printing, as shown in FIG. 5(j). In the figure, character A denotes the terminal area on which the bump is formed, character B, the flying lead area, and character C, the conductor area which may have the remaining metallic substrate 21, if necessary.

The process for producing a substrate for suspension according to the present invention commonly comprises the step of laminate preparation and the step of first metal etching. It is preferred that the production process of the invention further comprise the step of cover layer formation, the step of insulating layer etching, the step of protective deposit formation, the step of second metal etching, and the step of solder bump formation.

Each step in the process for producing a substrate for suspension according to the present invention will be described below.

1. Step of Laminate Preparation

The step of laminate preparation in the present invention will be first described. The step of laminate preparation in the present invention is the step of preparing a laminate of a metallic substrate, an insulating layer, a seed layer and a metal deposit that are situated in the order named.

In the present invention, since a laminate having the above-described lamination is used, a substrate for suspension having decreased rigidity can be obtained. Conventionally, a five-layered laminate has been used as a material for a substrate for suspension. Specifically, as shown in FIG.

6(a), there has been used a five-layered laminate containing a SUS plate as a metallic substrate 41, a thermoplastic polyimide (TPI) layer as an adhesive layer 42, a polyimide layer as an insulating layer 43, a TPI layer as an adhesive layer 44, and a Cu layer as a conductor-pattern-forming layer 45.

This laminate is usually made by press-bonding rolled copper or the like, which is spring copper. Since rolled copper is used, it has been impossible to obtain a thinner laminate having decreased rigidity. Moreover, since the above five-layered laminate is obtained by pressing the component layers, the surface irregularities of the conductor-pattern-forming layer (e.g., a rolled copper layer) are transferred to the insulating layer (e.g., a polyimide layer). Consequently, the surface of the insulating layer is roughened, and the roughened surface has been a hindrance to processing for making fine conductors.

Figure 6:
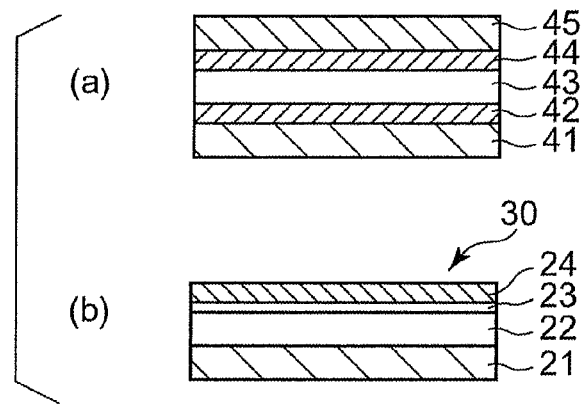
FIG. 6 is a diagrammatic cross-sectional view illustrating the lamination of a laminate.

On the other hand, a four-layered laminate 30 of a metallic substrate 41, an insulating layer 22, a seed layer 23, and a metal deposit 24 that are situated in the order named, as shown in FIG. 6(b), is used in the present invention. Since electroplating or the like is used to form the metal deposit in the four-layered laminate, it is possible to make the laminate thinner and less rigid, as compared with the conventional laminate for which rolled copper or the like is used, and also to form a fine conductor pattern layer. Furthermore, since the metal deposit in the four-layered laminate is formed by electroplating or the like, the surface of the insulating layer is not roughened unlike in the above-described five-layered laminate. The four-layered laminate is thus advantageous in that no foreign matters remain on the surface of the insulating layer.

The members of the laminate for use in the present invention will be described. The laminate for use in the invention usually contains a metallic substrate, an insulating layer, a seed layer and a metallic deposit.

Any material can be used for the metallic substrate, as long as it has electrical conductivity and a moderate degree of springness. Examples of materials useful for the metallic substrate include SUS. The thickness of the metallic substrate is preferably in the range between 10 µm and 30 µm, more preferably between 15 µm and 25 µm. A metallic substrate that is too thin may have decreased mechanical stability, and, with a metallic substrate that is too thick, it is difficult to produce a substrate for suspension having decreased rigidity.

Any material can be used to form the insulating layer as long as it has insulating properties. Examples of materials useful for the insulating layer include polyimides (PIs). The thickness of the insulating layer is preferably in the range between 5 µm and 30 µm, more preferably between 5 µm and 20 µm, most preferably between 5 µm and 10 µm. This is because an insulating layer that is too thin may not exhibit insulating properties satisfactorily, and with an insulating layer that is too thick, it is not easy to provide a substrate for suspension having decreased rigidity.

Any material can be used to form the seed layer as long as it can increase adhesion between the insulating layer and the metal deposit. Examples of materials useful for the seed layer include Ni, Cu, and Cr, and alloys thereof. It is preferred that the seed layer be a layer formed by sputtering. Although the seed layer can have any thickness as long as it can provide the desired adhesion, its thickness is usually in the range between 10 nm and 300 nm.

Any material can be used to form the metal deposit as long as it is excellent in electrical conductivity. Examples of materials herein useful for the metal deposit include copper (Cu). The thickness of the metal deposit is preferably in the range between 6 µm and 18 µm, more preferably between 8 µm and 12 µm. This is because a metal deposit that is too thin may have decreased mechanical stability, and with a metal deposit that is too thick, it is not easy to provide a substrate for suspension having decreased rigidity.

A conventional plating process can be used to form the metal deposit. In the present invention, it is particularly preferable to employ electroplating to form the metal deposit because electroplating can provide a metal deposit with highly accuracy. In the present invention, it is preferred that the difference between the maximum thickness and the minimum thickness of the metal deposit be 2 µm or less, particularly 1.6 µm or less.

In the present invention, the conductor pattern layer is formed by a method called subtractive process in which a metal deposit is etched to form a conductor pattern layer. There has also been known additive process as a method of forming a conductor pattern layer. This process is specifically as follows: a predetermined resist pattern is formed on an insulating layer, and, by electroplating or the like, a conductor pattern layer is formed on those portions of the insulating layer surface that are not covered with the resist. A conductor pattern layer formed by the above additive process has been at a disadvantage in that, since a non-uniform electrical field is produced because the density of the resist pattern is non-uniform, the conductor pattern layer formed is poor in uniformity in thickness. On the other hand, in the case where a conductor pattern layer is formed by the subtract process, which is used in the present invention, the thickness of the conductor pattern layer is determined by the thickness of the metal deposit in the laminate, so that the conductor pattern layer is highly uniform in thickness.

Any method can be used to make a laminate for use in the present invention, as long as it can provide the above-described laminate. Examples of methods useful herein include the following. A polyimide's-precursor-containing coating liquid is first applied to the surface of a SUS plate serving as the metallic substrate and is thermally treated to form a polyimide insulating layer. A seed layer is formed by means of sputtering, and Cu deposit is lastly formed as the metal deposit by electroplating.

2. Step of First Metal Etching

The step of first metal etching in the present invention will be described. This is the step of making a jig hole in the metallic substrate and forming a conductor pattern layer on the metal deposit, by conducting etching after forming patterned resist layers on the surfaces of the metallic substrate and of the metal deposit.

Specifically, the step of first metal etching is the step in which, after forming patterned resist layers 31, 32 on the surfaces of the metallic substrate 41 and of the metal deposit 24, a jig hole 21a is made in the surface of the metallic substrate 41, and the metal deposit 42 is processed into a conductor pattern layer 24a, as shown in FIGS. 4(b) and 4(c). In the present invention, if necessary, a cavity 21b for forming a flying lead area may also be made when the jig hole 21a is made. There is no need to make the cavity 21b when single-face connection is enough and double-face connection, which is made by the flying lead area, is not necessary.

In the present invention, although a jig hole, a cavity, etc. are made in the metallic substrate in the step of first metal etching, the most part of the metallic substrate is not removed by etching. Therefore, etching of the insulating layer, etc. can be conducted with the rigidity of the laminate held high, and the laminate under processing can be prevented from being deformed while it is carried from one step to another. In the present invention, processing of the metallic substrate, other than making the jig hole, is usually conducted in the step of second metal etching that will be described later.

In the present invention, when the metal deposit is processed into a conductor pattern layer, a jig hole is made in the metallic substrate. By this, the relative relationship between the position of the jig hole and that of the conductor pattern layer can be first determined. The term "jig hole" herein refers to a hole in which a jig for fixing the laminate is placed, and every positioning is done on the basis of this jig hole. In the present invention, the jig hole is used as the base for every positioning, so that it is possible to process the laminate with high accuracy. The shape of the jig hole varies depending on the shape of the jig to be used, and it is usually a circle or a rectangle. The jig hole can have any diameter, and its diameter is in the range between 0.5 mm and 3 mm, for example.

In the step of first metal etching, at least the jig hole is made in the metallic substrate, and, if necessary, a cavity for the flying lead area is also made simultaneously. If the metallic substrate in the laminate has a certain degree of rigidity after the step of first metal etching has been completed, the laminate under processing can be prevented from being deformed while it is carried from one step to another. It is preferred that the value of SA/ST be 0.6 or less, particularly in the range between 0.01 and 0.5, where SA denotes the area of those portions of the metallic substrate surface that are removed in the step of first metal etching, and ST denotes the area of the entire surface of the metallic substrate.

On the other hand, the metal deposit on the conductor side is etched to form a conductor pattern layer. Since the metal deposit for use in the present invention is usually thinner than conventional rolled copper, etc., a fine conductor pattern layer can be obtained. It is preferred that the width of the lines in the conductor pattern layer be 10 µm or more, more preferably in the range between 15 µm and 25 µm. The distance between two adjacent lines in the conductor pattern layer is e.g., 10 µm or more, preferably between in the range between 15 µm and 25 µm.

The resist for use in the present invention may be either in solid form or in liquid form. However, a liquid resist requires a greater number of steps than a solid resist, so that a solid resist is preferred to a liquid resist. Specifically, it is preferable to use a dry film resist (DFR) because a fine conductor pattern layer can be obtained.

Any conventional method can be employed to form pattern-wise resist layers on the surfaces of the metallic substrate and of the metal deposit. Specific examples of methods useful herein include the following. Resist films or layers are formed on the surfaces of the metallic substrate and of the metal deposit. They are exposed to light pattern-wise and are developed, thereby obtaining resist layers in the desired patterns.

Examples of methods for etching the metallic substrate and the metal deposit include we etching. It is preferable to select an etchant useful for we etching, with consideration for the materials of the metallic substrate and of the metal deposit. For instance, when the metallic substrate is a SUS plate, a ferric chloride etchant can be used. When the metal deposit is copper deposit, a ferric or copper chloride etchant can be used. In the present invention, although the metallic substrate and the metal deposit may be separately etched after forming patterned resist layers, it is preferable to etch them simultaneously. This is because the number of steps needed to etch the metallic substrate and the metal deposit simultaneously is smaller than that needed to etch them separately.

3. Step of Cover Layer Formation

Next, the step of cover layer formation in the present invention will be described. The step of cover layer formation in the invention is the step of forming, from a liquid covering material, a cover layer having openings so made that the surface of the conductor pattern layer is partly exposed.

Specifically, the step of cover layer formation in the present invention is the step of forming a cover layer 25 having openings 25a so made that the surface of the conductor pattern layer 24a has exposed portions 24b. A protective deposit, which will be described later, will be formed on those portions of the conductor pattern layer 24a surface that are exposed because of the above-described openings in the cover layer.

Figure 7:
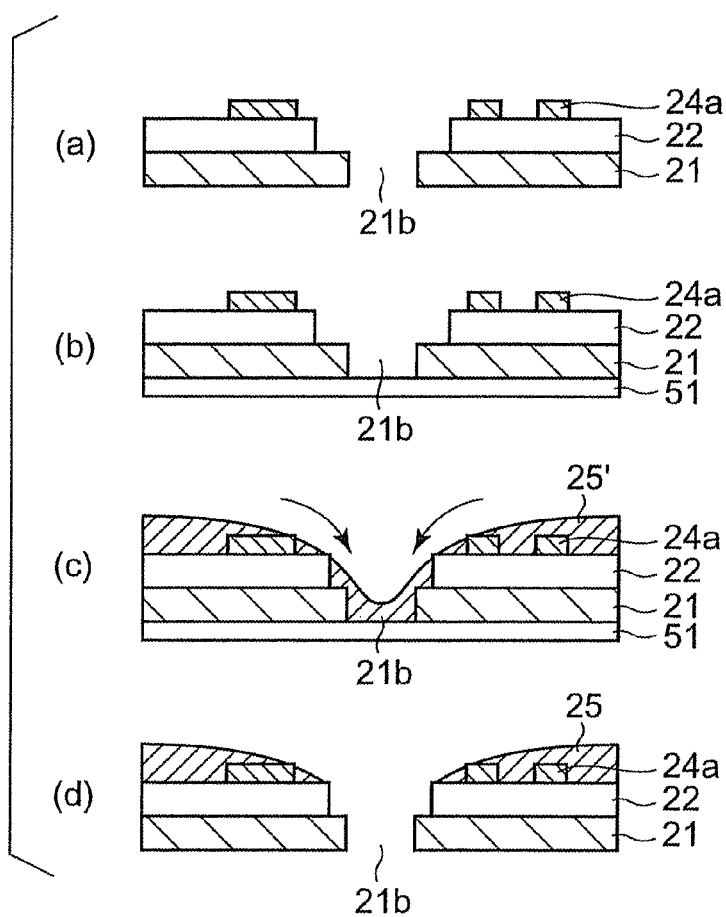
FIG. 7 is a view illustrating the conventional step of cover layer formation.

In the present invention, since the cover layer is formed before etching the insulating layer, the liquid covering material can be prevented from running into the jig hole, etc., which leads to the formation of a cover layer uniform in thickness. FIG. 7 is a view illustrating the conventional step of cover layer formation. In this figure, the seed layer is not depicted for convenience sake, and explanations of those parts that are denoted by the reference numerals appearing in FIG. 4 will not be repeated any more. Conventionally, the insulating layer 22 is etched before forming the cover layer, as shown in FIG. 7(a), so that the jig hole 21b is a through hole. It is therefore necessary to place a running-preventing layer 51 under the jig hole 21b when a liquid covering material is applied to form the cover layer (FIG. 7(b)). And even if the running-preventing layer 51 is placed, the liquid covering material 25' sometimes runs into the jig hole 21b (FIG. 7(c)). Consequently, the cover layer 25 formed is non-uniform in thickness and cannot completely cover the conductor pattern layer 24a (FIG. 7(d)).

Further, there is the problem that the difference between the thickness of the portion of the cover layer that covers the part of the conductor pattern layer in which the jig hole or cavity is present and the thickness of the portion of the cover layer that covers the part of the conductor pattern layer in which the jig hole or cavity is not present is great.

In an experimental example in which a cover layer was formed from a liquid covering material in the above-described conventional manner, the thickness of the dried cover layer was measured. As a result, the above-described difference in thickness was 2.9 µm on average (the number of samples: 8), and the cover layer was thus confirmed to be non-uniform in thickness.

Particularly when a cover layer with a relatively small thickness of e.g., 2.8 to 3.5 µm was formed, the portion of the cover layer that covered the part of the conductor pattern layer that is situated near the jig hole had a smaller thickness of 0.6 to 1.5 µm, and the conductor pattern layer was not covered completely with the cover layer.

Further, even when a dry film is used, instead of the liquid covering material, to form the cover layer, since the insulating layer has been etched beforehand, the dry film falls in the jig hole, and the portion of the cover layer that is present on the conductor near the jig hole is to have a thickness smaller than that present on the other part of the conductor layer.

In an experimental example in which a cover layer was formed in the above-described manner by the use of a dry film, since the thickness of the cover layer made of the dry film was greater than that of a cover layer formed from a liquid covering material, the conductor pattern layer was fully covered with the cover layer. However, the difference between the thickness of the portion of the cover layer that was near the jig hole and the thickness of the portion of the cover layer that was apart from the jig hole was 3.4 µm on average, showing that the cover layer was non-uniform in thickness.

Figure 8:
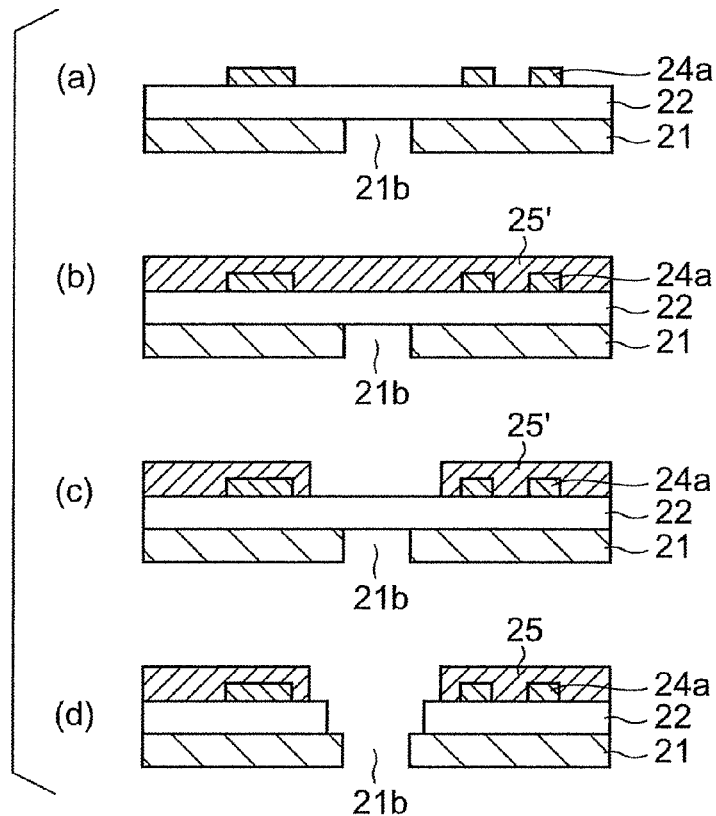
FIG. 8 is a view illustrating the step of cover layer formation in the present invention.

In the present invention, on the other hand, the cover layer is formed before etching the insulting layer, so that a liquid covering material can be prevented from running into the jig hole. FIG. 8 is a view illustrating the step of cover layer formation in the present invention. In this figure, the seed layer is not depicted for convenience sake, and explanations of those parts that are denoted by the reference numerals appearing in FIG. 4 will not be repeated any more. In the present invention, the cover layer is formed before etching the insulating layer 22, as shown in FIG. 8(*a*). The jig hole 21*b* is not a through hole unlike in the conventional process, so that a liquid covering material 25' never runs into the jig hole 21*b* (FIG. 8(*b*)). A cover layer 25 uniform in thickness can thus be obtained, and it is possible to prevent the occurrence of those portions of the conductor pattern layer 24*a* that are not covered with the cover layer 25 (FIG. 8(*c*)). After forming the cover layer 25, the insulating layer 22 is etched (FIG. 8(*d*)).

The liquid covering material for use in the present invention contains at least a cover-layer-forming resin. The liquid covering material may further contain a solvent that dissolves the cover-layer-forming resin, if necessary. Examples of cover-layer-forming resins include polyimide resins and epoxy resins. The cover-layer-forming resin may be either photosensitive or non-photosensitive, and non-photosensitive resins are preferred. A non-photosensitive resin can form a thin cover layer.

It is preferred that the viscosity of the liquid covering material be low. A liquid covering material with low viscosity can form a thin cover layer. The viscosity of the liquid covering material at normal temperatures is e.g., in the range between 500 cP and 5000 cP, preferably between 500 cP and 1000 cP.

The cover layer formed on the conductor pattern layer can have any thickness. The thickness of the cover layer is e.g., in the range between 3 µm and 20 µm, preferably in the range between 5 µm and 10 µm.

In an experimental example in which the insulating layer was etched after forming the cover layer from a liquid covering material, when a relatively thick cover layer was formed on the dried conductor pattern layer, the thickness of the portion of the cover layer that was present on the conductor pattern area situated near the jig hole was 6.4 µm on average, and the thickness of the other portion of the cover layer that was present on the conductor pattern area situated apart from the jig hole was 6.7 µm on average (the number of samples: 8). The difference between the above two thicknesses was 0.3 µm, and it was thus confirmed that the cover layer was formed uniformly in thickness with high accuracy.

When a relatively thin cover layer was formed on the dried conductor pattern layer, the thickness of the portion of the cover layer that was present on the conductor pattern area situated near the jig hole 21*b* (see FIG. 8) was 3.6 µm on average, and the thickness of the other portion of the cover layer that was present on the conductor pattern area situated apart from the jig hole 21*b* was 3.8 µm on average (the number of samples: 8). The difference between the above two thicknesses was 0.2 µm, and it was thus confirmed that the cover layer was formed uniformly in thickness with high accuracy.

It is therefore preferred in the present invention that the difference between the maximum thickness and the minimum thickness of the cover layer formed on the conductor pattern layer be e.g., 1.3 µm or less, particularly 1.0 µm or less.

The conductor pattern area situated near the jig hole 21*b* is herein not limited to the area near the jig hole, but may be the area near the cavity, or the area in which the insulating layer has been removed by etching. The conductor pattern area situated apart from the jig hole may also be defined as the area in which the insulating layer remains after it has been etched.

In the present invention, the cover layer can be formed accurately and uniformly in thickness on the entire surface of the conductor pattern area. It has been impossible to form a thin cover layer in the conventional manner because a layer formed in the conventional manner is highly non-uniform in thickness. In the present invention, on the other hand, a thin cover layer can be formed with high accuracy.

In the present invention, since the cover layer has a decreased thickness, only a decreased amount of the material is needed to form the cover layer. Production costs of the substrate for suspension can therefore be held down. Further, since a magnetic head suspension obtained by mounting a slider on the substrate for suspension of the present invention can have a degreased weight, only a reduced inertia force is needed to drive the suspension. It is thus possible to provide an HDD whose electric consumption is smaller.

Any method can be employed to form the cover layer as long as it uses a liquid covering material. For example, when the liquid covering material contains a photosensitive resin, the following method can be employed. The liquid covering material is applied so that it covers the conductor pattern layer and is dried; and the dried layer is exposed to light and is developed. On the other hand, when the liquid covering material contains a non-photosensitive resin, the following method can be employed. The liquid covering material is applied so that it covers the conductor layer, and is dried to form a non-photosensitive resin layer. On this non-photosensitive resin layer, a photosensitive resin layer is formed and is exposed pattern-wise to light. After this, the non-photosensitive resin layer is etched simultaneously with the development of the exposed photosensitive resin layer. The photosensitive resin layer is lastly removed. In this manner, a thin cover layer can be obtained.

4. Step of Insulating Layer Etching

The step of insulating layer etching in the present invention will be described. This is the step of etching the insulating layer after forming the cover layer.

Specifically, the step of insulating layer etching in the present invention is the step of etching the insulating layer 22 with an etchant after forming patterned resist layers 33, 34 for polyimide etching on both sides of the laminate 30, as shown in FIGS. 4(*e*) and 4(*f*). In this step, the jig hole 21*a* finally becomes a through hole. A cavity 21*b* for the flying lead area may also be made simultaneously, if necessary.

In the present invention, the step of insulating layer etching can be performed either before or after the step of protective deposit formation that will be described later. However, for example, when a substrate for suspension having a flying lead area with which double-face connection can be made, the step of insulating layer etching is usually performed before the step of protective deposit formation. This is because it is necessary to make a cavity for the flying lead area. On the other hand, the step of insulating layer etching and the step of protective deposit formation may be performed in any order when double-face connection is not necessary and only single-face connection is enough.

In the present invention, it is preferred that the pattern into which the insulating layer is etched be determined according to the intended shape of the substrate for suspension, and so on. Further, the following method can be used to etch the insulating layer, for example. After forming pattern-wise a resist layer so that the resist covers those portions of the insulating layer that should not be removed by etching, the insulating layer is etched with a predetermined etchant. In the present invention, it is preferable to use a dry film resist. Such a technique as plasma etching may also be used to etch the insulating layer.

5. Step of Protective Deposit Formation

The step of protective deposit formation in the present invention will be described. This is the step of forming a protective deposit on those portions of the surface of the conductor pattern layer that are exposed because of the above-described openings in the cover layer.

Specifically, the step of protective deposit formation in the invention is the step of forming a protective deposit 26 on those portions 24b of the conductor pattern layer 24a surface that are exposed because of the openings 25a that have been made in the cover layer in the step of cover layer formation.

In the present invention, the cover layer is first formed, and the protective deposit is formed only on those portions of the conductor pattern layer surface that are exposed because of the openings in the cover layer, so that a substrate for suspension having low rigidity can be obtained. In the conventional manner, the protective deposit is formed before forming the cover layer, and, as shown in FIG. 9(a), the protective deposit 26 is formed on the surface and side of the conductor pattern layer 24a, for example. Therefore, it has been impossible to obtain a substrate for suspension having satisfactorily decreased rigidity in the conventional manner.

Figure 9:
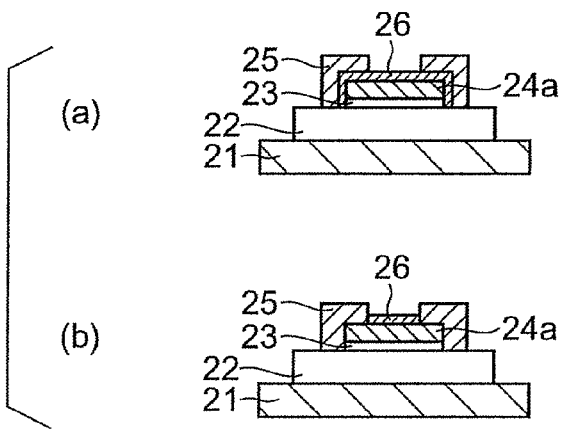
FIG. 9 is a view illustrating a protective deposit.

In the present invention, on the other hand, the cover layer is formed before forming the protective deposit, so that, as shown in FIG. 9(b), the protective deposit 26 can be formed only on necessary portions of the surface of the conductor pattern layer 24a. It is thus possible to obtain a substrate for suspension having satisfactorily decreased rigidity. Those parts shown in FIG. 9 that are denoted by the reference numerals appearing in FIG. 4 will not be explained any more in the following description.

Any material can be used for the protective deposit in the present invention, as long as it can protect the conductor pattern layer, etc. from corrosion. Examples of materials useful herein for the protective deposit include nickel (Ni) and gold (Au). Gold (Au) is preferred because it is excellent in anticorrosion.

It is preferred that the thickness of the protective deposit be e.g., 5 μm or less, particularly in the range between 1 μm and 2 μm. This is because a protective deposit having a thickness in the above range can effectively protect the conductor pattern layer from corrosion, etc.

A conventional plating process can be used to form the protective deposit. In the present invention, it is particularly preferable to form the protective deposit by electroplating, because electroplating can provide the protective deposit with high accuracy.

6. Step of Second Metal Etching

Next, the step of second metal etching in the present invention will be described. This is the step of processing the external side of the metallic substrate after performing the step of insulating layer etching and the step of protective deposit formation.

Specifically, the step of second metal etching in the invention is the step of processing the external side of the metallic substrate 41 with an etchant, after forming patterned resist layers 35, 36 for metal etching on both sides of the laminate 30, as shown in FIGS. 5(h) and 5(i).

In the present invention, although a jig hole, a cavity, etc. are made in the metallic substrate in the step of first metal etching, the most part of the metallic substrate is not removed by etching. Therefore, etching of the insulating layer, etc. can be conducted with the rigidity of the laminate held high, and the laminate under processing can be prevented from being deformed while it is carried from one step to another. After the step of etching the insulating layer, etc. have been completed, the metallic substrate that is not yet processed is etched into a predetermined pattern. In this manner, there can be produced a substrate for suspension having low rigidity with high yields.

The method for etching the metallic substrate, the type of the etchant to be used, and the like are the same as the ones described in the above "1. Step of First Metal Etching", so that their explanations will not be repeated in the following description.

7. Step of Solder Bump Formation

In the present invention, the step of solder bump formation in which a solder bump is formed on the protective deposit in the terminal area may be performed after the step of second metal etching. The step of solder bump formation is the step of forming a solder bump 27 on the surface of the protective deposit 26 in the terminal area A, as shown in FIG. 5(j).

Solder useful for forming the solder bump can be roughly classified into two groups, lead-containing solder and lead-free solder. In the present invention, lead-free solder is used preferably because it is environmentally friendly. Specific examples of lead-free solder useful herein include Sn—Sb, Sn—Cu, Sn—Cu—Ni, Sn—Ag, Sn—Ag—Cu, Sn—Ag—Cu—Bi, Sn—Zn, Sn—Ag—In—Bi, Sn—Zn—Bi, Sn—In, and Sn—Sb solders.

Any method can be employed to form the solder bump, as long as it can provide the desired solder bump. For example, such a process as screen process printing, dispensing, or ink jetting can be used, and, of these, screen process printing is preferred.

8. Others

As described in the above "3. Step of Cover Layer Formation", it is possible to prevent a liquid covering material from running into the jig hole by forming the cover layer before etching the insulating layer. From this point of view, the present invention can provide a process for producing a substrate for suspension, comprising the step of laminate preparation, the step of first metal etching, the step of cover layer formation, the step of insulating layer etching, and the step of second metal etching. The details of each step are the same as those of the steps described above, so that they will not be described now.

In the present invention, the step of dry cover layer formation in which the cover layer is formed by the use of a dry film useful for forming a cover layer can be performed instead of the above-described step of cover layer formation. The reason for this is as follows. By forming the cover layer before etching the insulating layer, the dry film can be prevented from falling in the jig hole, etc. when it is laminated to the conductor pattern layer. A cover layer uniform in thickness can therefore be formed. Moreover, the thickness of the cover layer in the substrate for suspension can be made uniform.

In the step of dry cover layer formation, any method can be employed to form a cover layer as long as it uses a dry film useful for forming a cover layer. Specifically, the following method can be employed, for example. The dry film for forming a cover layer is placed so that it covers the surface of the conductor pattern layer and is thermally pressed, thereby laminating the dry film to the conductor pattern layer. Subsequently, the dry film laminated to the conductor pattern layer is exposed to light and is developed.

The method for exposing the dry film to light and developing the exposed dry film, to be used in this step may be the same as the one described in the above item "3. Step of Cover Layer Formation". The dry film may be one that is commonly used in the production of a substrate for suspension.

Further, in the present invention, the step of etching the insulating layer before forming the cover layer may also be performed instead of the above-described step of insulating layer etching, if necessary.

Furthermore, as described in the above "5. Step of Protective Deposit Formation", there can be obtained a substrate for suspension having low rigidity by firstly forming the cover layer and then forming the protective deposit only on those portions of the conductor pattern surface that are exposed because of the openings in the cover layer. From this point of view, the present invention can provide a process for producing a substrate for suspension, comprising the step of laminate preparation, the step of first metal etching, the step of cover layer formation, the step of protective deposit formation, and the step of second metal etching. The details of these steps are the same as those of the steps described above, so that they will not be described now.

The present invention is not limited to the above-described embodiment. The aforementioned embodiment is to be considered in all respects as illustrative and not restrictive, and all changes which come within the meaning and range of equivalency of the appended claim are therefore intended to be embraced in the scope of the invention.

EXAMPLE

The present invention will now be described more specifically by way of Example.

Example 1

A polyimide layer (insulating layer) with a thickness of 10 µm was formed on a SUS 304-made, 20-µm thick plate (metallic substrate) by coating, and Ni—Cr—Cu was deposited on the insulating layer to form a seed layer with a thickness of about 300 nm by sputtering. Using the seed layer as a feeder layer, Cu deposit (metal deposit) with a thickness of 9 µm was formed, thereby obtaining a four-layered laminate (see FIG. 4(a)). From this four-layered laminate, a low-rigidity substrate for suspension having fine conductors was produced.

Dry films placed on both sides of the laminate were patterned at one time so that the patterned dry films were useful for making a jig hole on the SUS plate side, in which high positional accuracy is essential, and for forming the desired conductor pattern layer on the Cu plating side. The laminate covered with the above patterned resist films was etched with a ferric chloride solution, and the resist films were stripped (the step of first metal etching, see FIGS. 4(b) and 4(c)). In this step, since the two dry films are patterned at one time, improved positional accuracy can be secured on both sides of the laminate, the SUS plate side and the conductor pattern layer side. The width of copper lines in the conductor pattern layer was 20 µm, and the distance between two adjacent copper lines was 20 µm. It is considered that the absence of anchor-shaped portions in the conductor pattern layer and the use of highly sensitive DFRs greatly contribute to realization of finer conductors.

Next, a liquid covering material containing a non-photosensitive polyimide was applied with a die coater and was dried. A patterned resist layer was formed on it, and the covering material was etched simultaneously with the development of the resist layer, and was hardened to form a cover layer (see FIG. 4(d)). The thickness of the hardened cover layer on the conductor layer was 5 µm. Such a cover layer can prevent the substrate for suspension from being warped, can make the substrate for suspension less rigid, and can protect the conductor pattern layer.

Next, the 10-µm thick polyimide layer (insulating layer) was covered with a patterned resist layer and was etched with an organic alkali etchant, thereby obtaining a patterned insulating layer (see FIGS. 4(e) and 4(f)). After this, Au was deposited by plating on the exposed portions of the conductor pattern layer to form a protective deposit with a thickness of 2 µm (see FIG. 5(g)). In the present invention, the conductor pattern layer is protected before conducting plating, so that Au is deposited only on those portions of the conductor pattern layer that are not covered with the cover layer. This is highly effective in decreasing rigidity and in reducing the amount of Au to be used.

Next, in order to process the external side of the SUS plate, the SUS plate was covered with a patterned resist layer and was etched in the same manner as in the above-described step of first metal etching (the step of second metal etching, see FIGS. 5(h) and 5(i)). Lastly, after the step of second metal etching, a solder bump was formed by screen process printing, using a lead-free solder paste (FIG. 5(j)). The substrate for suspension obtained in this manner was confirmed to have decreased rigidity and to have finer conductors as compared with a conventional substrate for suspension.

The invention claimed is:

1. A substrate for suspension, comprising:
a metallic substrate,
an insulating layer formed from an insulating-layer-forming material on the metallic substrate,
a conductor layer formed on the insulating layer, and
a cover layer formed from a cover-layer-forming material on the insulating layer, covering at least a part of the conductor layer,
wherein the insulating-layer-forming material and the cover-layer-forming material are different materials,
wherein the insulating-layer-forming material and the cover-layer-forming material are formed of a polyimide precursor solution including an acid anhydride and a diamine,
wherein the insulating-layer-forming material and the cover-layer-forming material are subjected to a heat treatment so that the insulating-layer-forming material and the cover-layer-forming material have coefficients of hygroscopic expansion of 0/% RH to $30 \times 10^{-6}$/% RH, the difference between the coefficients of hygroscopic expansion of the two materials being in the range between 0/% RH and $5 \times 10^{-6}$/% RH, wherein the insulating-layer-forming material and the cover-layer-forming material have a repeating unit represented by the following formula:

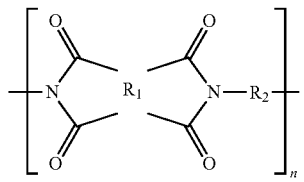

(1)

wherein $R_1$ is a tetravalent organic group, $R_2$ is a divalent organic group, $R_1$ and $R_2$ being either a single structure or a combination of two or more structures, and n is a natural number of 1 or more, wherein the insulating-layer-forming material and the cover-layer-forming material have coefficients of thermal expansion of $15\times10^{-6}/°$ C. to $30\times10^{-6}/°$ C., and the difference between the coefficients of thermal expansion of the two materials is $10\times10^{-6}/°$ C. or less, and wherein the metallic substrate has an open area formed by etching in the metallic substrate so as to expose the insulating layer outside through the open area and to decrease a rigidity of the substrate for suspension, and a warpage of a 50 mm×10 mm strip of the metallic substrate is 0.5 mm or less when placed in a thermo-hygrostat at 85° C. and 85% RH for one hour.

2. The substrate for suspension according to claim 1, wherein both of the insulating-layer-forming material and the cover-layer-forming material, or either of the two, is non-photosensitive.

3. A magnetic head suspension comprising a substrate for suspension, the substrate for suspension comprising:

a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, wherein the insulating-layer-forming material and the cover-layer-forming material are different materials, wherein the insulating-layer-forming material and the cover-layer-forming material are formed of a polyimide precursor solution including an acid anhydride and a diamine, wherein the insulating-layer-forming material and the cover-layer-forming material are subjected to a heat treatment so that the insulating-layer-forming material and the cover-layer-forming material have coefficients of hygroscopic expansion of 0/% RH to $30\times10^{-6}/\%$ RH, the difference between the coefficients of hygroscopic expansion of the two materials being in the range between 0/% RH and $5\times10^{-6}/\%$ RH, wherein the insulating-layer-forming material and the cover-layer-forming material have a repeating unit represented by the following formula:

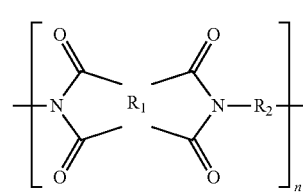

(1)

wherein $R_1$ is a tetravalent organic group, $R_2$ is a divalent organic group, $R_1$ and $R_2$ being either a single structure or a combination of two or more structures, and n is a natural number of 1 or more, wherein the insulating-layer-forming material and the cover-layer-forming material have coefficients of thermal expansion of $15\times10^{-6}/°$ C. to $30\times10^{-6}/°$ C., and the difference between the coefficients of thermal expansion of the two materials is $10\times10^{-6}/°$ C. or less, and wherein the metallic substrate has an open area formed by etching in the metallic substrate so as to expose the insulating layer outside through the open area and to decrease a rigidity of the substrate for suspension, and a warpage of a 50 mm×10 mm strip of the metallic substrate is 0.5 mm or less when placed in a thermo-hygrostat at 85° C. and 85% RH for one hour.

4. A hard disk drive comprising a substrate for suspension, the substrate for suspension comprising:

a metallic substrate, an insulating layer formed from an insulating-layer-forming material on the metallic substrate, a conductor layer formed on the insulating layer, and a cover layer formed from a cover-layer-forming material on the insulating layer, covering at least a part of the conductor layer, wherein the insulating-layer-forming material and the cover-layer-forming material are different materials, wherein the insulating-layer-forming material and the cover-layer-forming material are formed of a polyimide precursor solution including an acid anhydride and a diamine, wherein the insulating-layer-forming material and the cover-layer-forming material are subjected to a heat treatment so that the insulating-layer-forming material and the cover-layer-forming material have coefficients of hygroscopic expansion of 0/% RH to $30\times10^{-6}/\%$ RH, the difference between the coefficients of hygroscopic expansion of the two materials being in the range between 0/% RH and $5\times10^{-6}/\%$ RH, wherein the insulating-layer-forming material and the cover-layer-forming material have a repeating unit represented by the following formula:

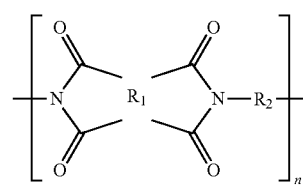

(1)

wherein $R_1$ is a tetravalent organic group, $R_2$ is a divalent organic group, $R_1$ and $R_2$ being either a single structure or a combination of two or more structures, and n is a natural number of 1 or more, wherein the insulating-layer-forming material and the cover-layer-forming material have coefficients of thermal expansion of $15\times10^{-6}/°$ C. to $30\times10^{-6}/°$ C., and the difference between the coefficients of thermal expansion of the two materials is $10\times10^{-6}/°$ C. or less, and wherein the metallic substrate has an open area formed by etching in the metallic substrate so as to expose the insulating layer outside through the open area and to decrease a rigidity of the substrate for suspension, and a warpage of a 50 mm×10 mm strip of the metallic substrate is 0.5 mm or less when placed in a thermo-hygrostat at 85° C. and 85% RH for one hour.

* * * * *